US010916447B2

(12) United States Patent
Fujioka et al.

(10) Patent No.: US 10,916,447 B2
(45) Date of Patent: Feb. 9, 2021

(54) SEMICONDUCTOR DEVICE AND METHOD FOR MANUFACTURING SEMICONDUCTOR DEVICE

(71) Applicant: Mitsubishi Electric Corporation, Chiyoda-ku (JP)

(72) Inventors: Yasushi Fujioka, Tokyo (JP); Takeo Furuhata, Tokyo (JP); Tomohiro Shinagawa, Tokyo (JP); Keisuke Nakamura, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/078,494

(22) PCT Filed: Mar. 14, 2017

(86) PCT No.: PCT/JP2017/010202
§ 371 (c)(1),
(2) Date: Aug. 21, 2018

(87) PCT Pub. No.: WO2017/159682
PCT Pub. Date: Sep. 21, 2017

(65) Prior Publication Data
US 2019/0051538 A1 Feb. 14, 2019

(30) Foreign Application Priority Data
Mar. 18, 2016 (JP) .................. 2016-054669

(51) Int. Cl.
*H01L 29/20* (2006.01)
*H01L 29/66* (2006.01)
(Continued)

(52) U.S. Cl.
CPC ............ *H01L 21/481* (2013.01); *C23C 16/02* (2013.01); *C23C 16/27* (2013.01);
(Continued)

(58) Field of Classification Search
CPC .......... H01L 29/7786; H01L 29/66462; H01L 29/7787; H01L 29/0649; H01L 29/2003;
(Continued)

(56) References Cited

U.S. PATENT DOCUMENTS 5,562,769 A * 10/1996 Dreifus ................... C23C 16/02
117/103
5,782,975 A * 7/1998 Linn ....................... C23C 16/01
117/89
(Continued)

FOREIGN PATENT DOCUMENTS

JP          4082769 B2    4/2008
JP       2015-517205 A    6/2015
WO    WO 2013/142156 A1    9/2013

OTHER PUBLICATIONS

International Search Report dated Jun. 13, 2017 in PCT/JP2017/010202 filed Mar. 14, 2017.
(Continued)

*Primary Examiner* — Natalia A Gondarenko
(74) *Attorney, Agent, or Firm* — Xsensus LLP

(57) ABSTRACT

In a semiconductor device including a crystalline nitride layer, in which diamond is used for heat dissipation thereof, it is an object of the present invention to suppress cracking of the crystalline nitride layer. The semiconductor device includes a layered body and a heat dissipation layer. The layered body includes a crystalline nitride layer and a composite layer. The composite layer includes a non-inhibiting portion which does not inhibit diamond growth on a surface thereof and an inhibiting portion which inhibits the diamond growth on the surface. A layered body main surface of the layered body has a first region in which the non-inhibiting portion is exposed and a second region in which the inhibiting portion is exposed. The heat dissipation layer is made of diamond, opposed to the main surface, adhered (Continued)

to the first region, and separated from the second region with a void interposed therebetween.

13 Claims, 10 Drawing Sheets

(51) Int. Cl.
  *H01L 29/778* (2006.01)
  *H01L 21/48* (2006.01)
  *H01L 23/373* (2006.01)
  *C23C 16/02* (2006.01)
  *C23C 16/27* (2006.01)
  *H01L 21/268* (2006.01)
  *H01L 29/06* (2006.01)

(52) U.S. Cl.
  CPC .... *H01L 23/3732* (2013.01); *H01L 29/66462* (2013.01); *H01L 29/7786* (2013.01); *H01L 29/7787* (2013.01); *H01L 21/268* (2013.01); *H01L 29/0649* (2013.01); *H01L 29/2003* (2013.01)

(58) Field of Classification Search
  CPC . H01L 21/481; H01L 21/268; H01L 23/3732; H01L 21/311; H01L 21/31111; H01L 21/31122; H01L 21/02241; H01L 21/02389; H01L 21/02433; H01L 21/02529; H01L 21/02631; H01L 21/02115; H01L 29/267; H01L 29/1029; H01L 29/1608; H01L 29/42316; H01L 29/66242; H01L 29/66431; H01L 21/0254; H01L 21/02458; H01L 21/0262; H01L 21/02381; H01L 21/02527; H01L 21/02532; H01L 21/0245; C23C 16/27; C23C 16/02; C30B 25/186
  USPC ..... 257/76, 77, 347, 640, 649, 52, 614, 506, 257/629; 438/759, 694
  See application file for complete search history.

(56) References Cited

U.S. PATENT DOCUMENTS

| | | | |
|---|---|---|---|
| 6,383,288 B1 | 5/2002 | Hayashi et al. | |
| 2005/0189544 A1* | 9/2005 | Ravi | C30B 25/18 257/77 |
| 2008/0296586 A1* | 12/2008 | Francis | G01T 1/24 257/77 |
| 2013/0248879 A1 | 9/2013 | Gambin et al. | |
| 2017/0247811 A1* | 8/2017 | Noguchi | H01L 21/02376 |

OTHER PUBLICATIONS

Office Action dated Jun. 29, 2020 in United Kingdom Application No. GB1810879.5, 4 pages.

* cited by examiner

F I G 1
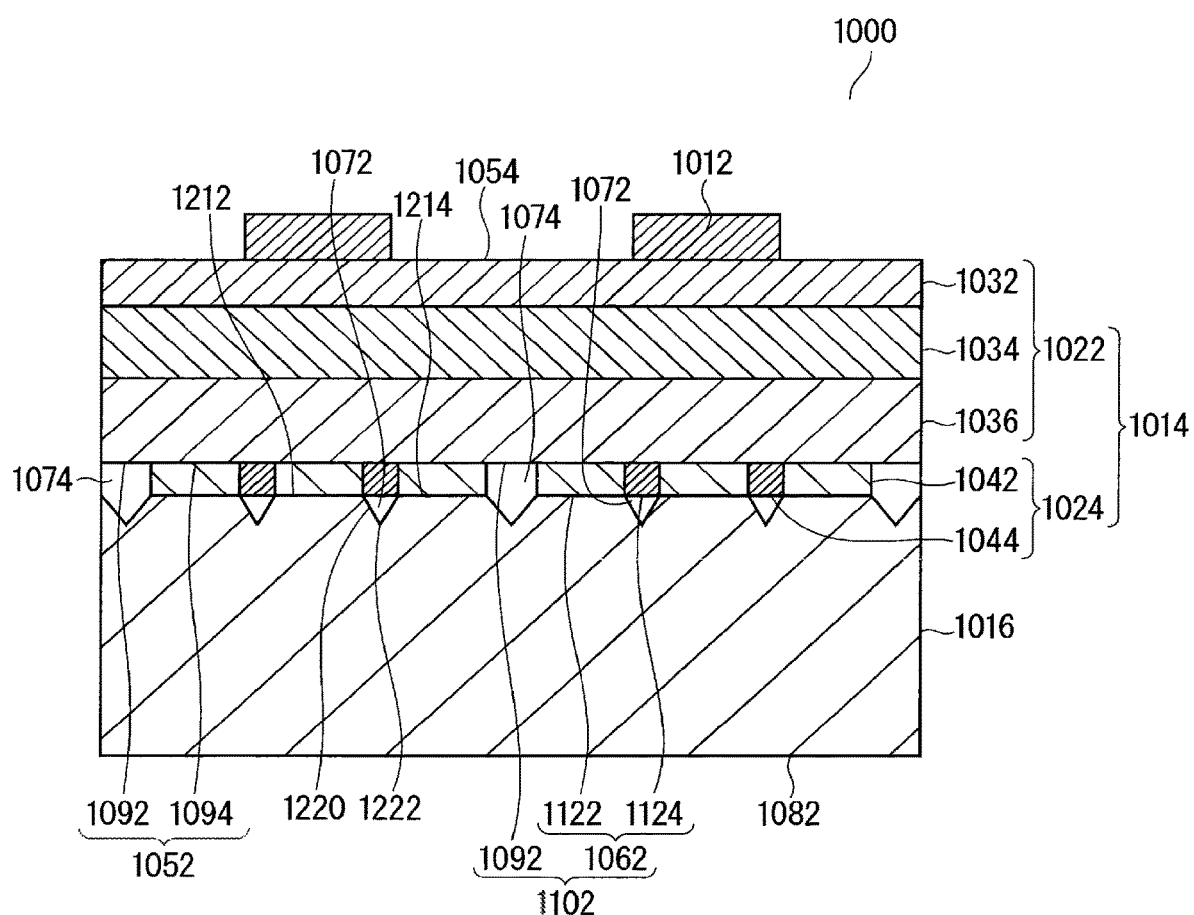

F I G. 1 2
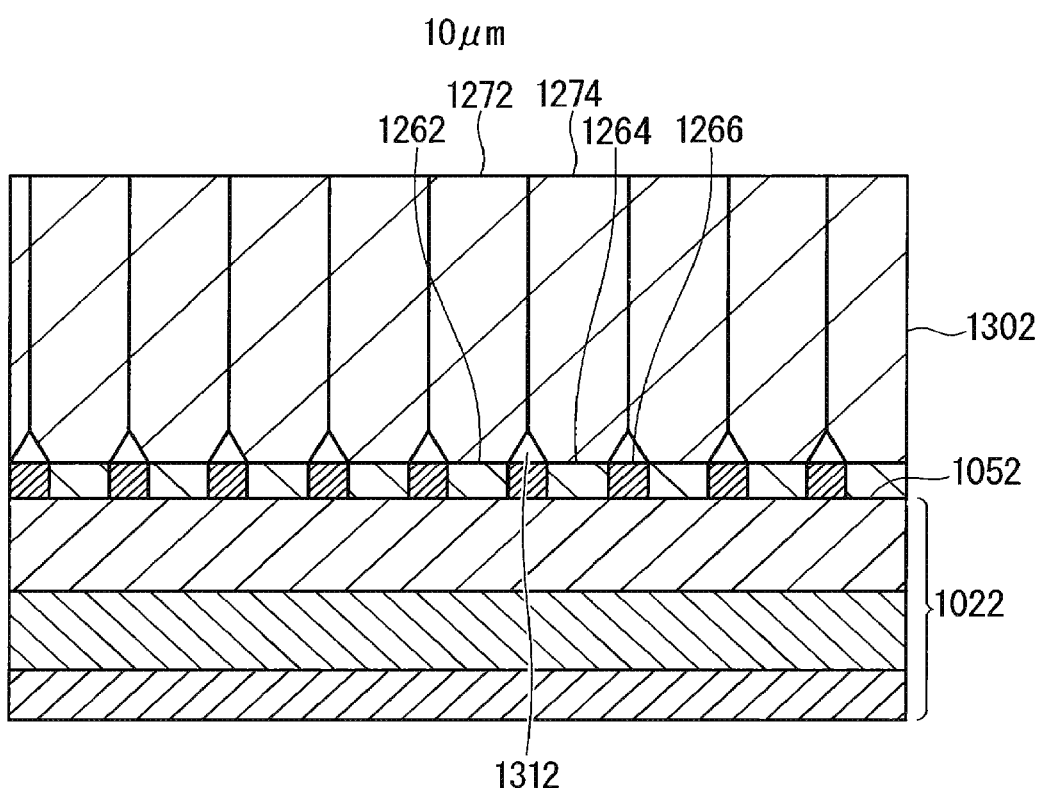

SEMICONDUCTOR DEVICE AND METHOD FOR MANUFACTURING SEMICONDUCTOR DEVICE

TECHNICAL FIELD

The present invention relates to a semiconductor device and a method of manufacturing the semiconductor device.

BACKGROUND ART

A group III nitride such as gallium nitride (GaN), aluminum nitride (AlN), aluminum gallium nitride (AlGaN), or the like has a high dielectric breakdown electric field and high carrier mobility. For this reason, a high-frequency device such as a high-frequency electron device, a high-frequency optical device, or the like suitably adopts the group III nitride. In a case where the high-frequency device adopts the group III nitride, however, self-heating in a high output operation deteriorates output characteristics of the high-frequency device.

For solving this problem, diamond having high thermal conductivity is used for heat dissipation of the high-frequency device. The technique disclosed in Patent Document 1 is an exemplary technique therefor.

In the technique disclosed in Patent Document 1, in a HEMT device, an AlN nucleation layer, a GaN buffer layer, an AlGaN barrier layer, and a device layer are formed on a main surface of a substrate made of SiC, silicon, or the like, and a via is thereby formed on the substrate and the via is filled with diamond.

In a case where diamond is used for heat dissipation of the high-frequency device, the heat dissipation performance of the high-frequency device is improved and the high-frequency device thereby becomes able to perform a high output operation. In a case where diamond is used for heat dissipation of a field effect transistor, for example, the field effect transistor becomes able to perform a high output operation.

PRIOR ART DOCUMENTS

Patent Documents

[Patent Document 1] Japanese Patent Application Laid Open Gazette No. 2015-517205

SUMMARY

Problem to be Solved by the Invention

In a high-frequency device including a crystalline nitride layer, in which diamond is used for heat dissipation thereof, there is sometimes a case where cracking occurs in the crystalline nitride layer. This problem may arise not only in the high-frequency devices but also generally in semiconductor devices including a crystalline nitride layer, in which diamond is used for heat dissipation thereof.

The present invention is intended to solve this problem. It is an object of the present invention to suppress cracking of a crystalline nitride layer in a semiconductor device including the crystalline nitride layer, in which diamond is used for heat dissipation thereof.

Means to Solve the Problem

A semiconductor device includes a layered body and a heat dissipation layer.

The layered body includes a crystalline nitride layer and a composite layer. The composite layer includes a non-inhibiting portion which does not inhibit diamond growth on a surface thereof and an inhibiting portion which inhibits the diamond growth on the surface. A layered body main surface of the layered body has a first region in which the non-inhibiting portion is exposed and a second region in which the inhibiting portion is exposed.

The heat dissipation layer is made of diamond, opposed to the layered body main surface, adhered to the first region, and separated from the second region with a void interposed therebetween.

Effects of the Invention

According to the present invention, a stress caused by great difference between the linear expansion coefficient of the heat dissipation layer made of diamond and that of the crystalline nitride layer is relieved by the void, and it is thereby possible to suppress cracking in the crystalline nitride layer.

These and other objects, features, aspects and advantages of the present invention will become more apparent from the following detailed description of the present invention when taken in conjunction with the accompanying drawings.

BRIEF DESCRIPTION OF DRAWINGS

FIG. 1 is a cross section showing a semiconductor device in accordance with a first preferred embodiment;

FIG. 12 is yet another cross section showing the sub portions of the amorphous portion, diamond, and the like formed on the crystalline nitride layer included in the semiconductor device in accordance with the first preferred embodiment;

DESCRIPTION OF EMBODIMENT(S)

Figure 2:
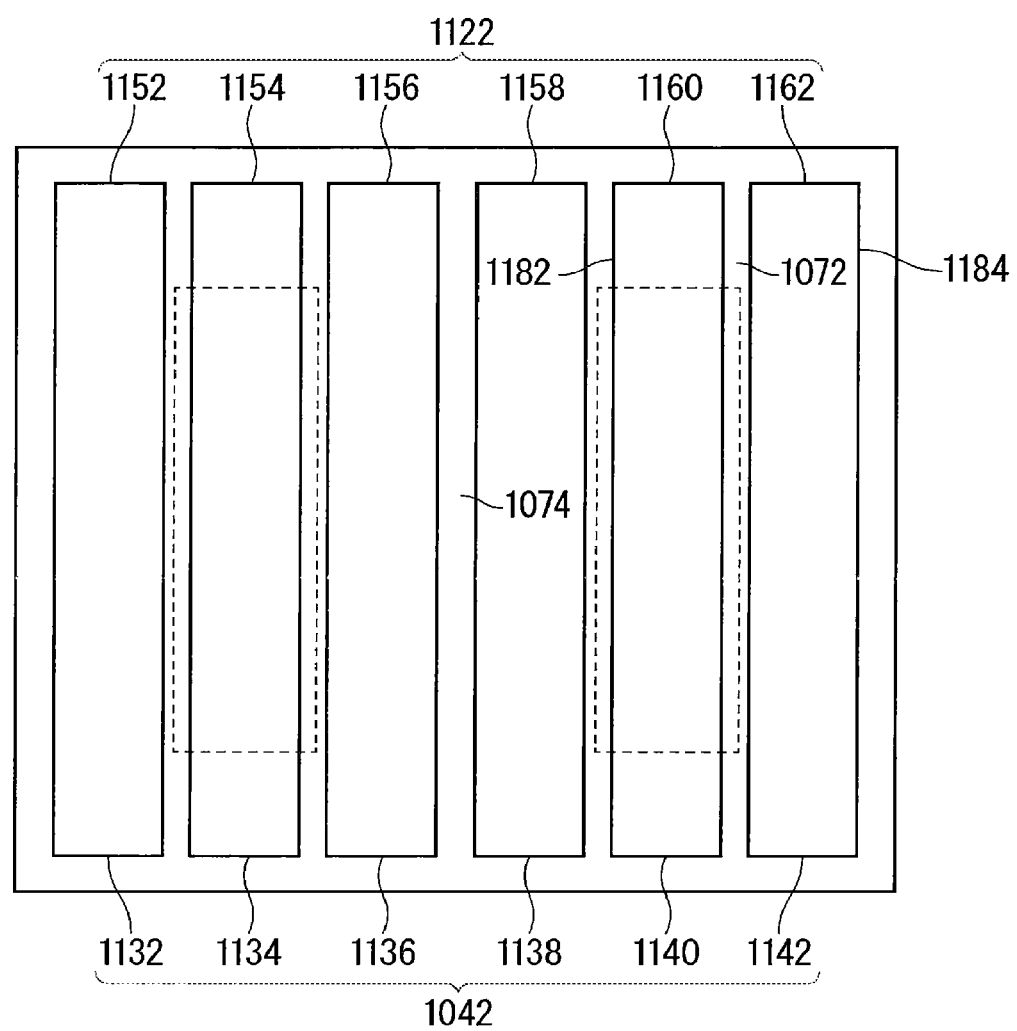
FIG. 2 is a view showing a planar arrangement of an amorphous portion and voids included in the semiconductor device in accordance with first, second, third, and fourth preferred embodiments.

1. The First Preferred Embodiment 1.1 Causes of Cracking of Crystalline Nitride Layer in Semiconductor Device Table 1 shows respective linear expansion coefficients and thermal conductivities of diamond, gallium nitride (GaN), aluminum nitride (AlN), and silicon (Si).

TABLE 1

| Materials | Linear Expansion Coefficient ($\times 10^{-6}$/K) | Thermal Conductivity (W/m · K) |
|---|---|---|
| Diamond | 1.1 | 2000 |
| GaN | 5.6 (a axis) | 220 |
| AlN | 4.3 | 170 |
| Si | 2.6 | 150 |

As shown in Table 1, the thermal conductivity of diamond is remarkably larger than that of the group III nitride such as GaN, AlN, or the like. For this reason, in a case where diamond is used for heat dissipation in a semiconductor device which adopts the group III nitride, the heat dissipation performance of the semiconductor device is improved.

On the other hand, the linear expansion coefficient of diamond is remarkably smaller than that of the group III nitride such as GaN, AlN, or the like. For this reason, in a case where a diamond layer comes into contact with a crystalline nitride layer made of a group III nitride in a semiconductor device which adopts the group III nitride, cracking occurs in the crystalline nitride layer by a stress caused by great difference between the linear expansion coefficient of the diamond layer and that of the crystalline nitride layer.

For example, a GaN layer has a large linear expansion coefficient of $5.6 \times 10^{-6}$/K in an inplane direction and a diamond layer has a small linear expansion coefficient of $1.1 \times 10^{-6}$/K, and the difference in the linear expansion coefficient between the GaN layer and the diamond layer reaches $4.5 \times 10^{-6}$/K. For this reason, in a case where the diamond layer is formed on one main surface of the GaN layer at a high temperature of about 1000° C. and then a complex of the GaN layer and the diamond layer is cooled to a room temperature of 25° C., a differential shrinkage indicating the difference in the shrinkage between the GaN layer and the diamond layer during the cooling of 975° C. reaches 0.44 mm per 100 mm. A warp in which the other main surface of the GaN layer becomes a concave surface is caused in the complex by this differential shrinkage, and a stress thereby occurs in the GaN layer. Therefore, in a case where the diamond layer is in direct contact with the GaN layer, cracking occurs in the GaN layer by these warp and stress.

In the first to fourth preferred embodiments, a void for relieving the stress is formed between the crystalline nitride layer and the diamond layer included in the semiconductor device, to thereby suppress the cracking of the crystalline nitride layer.

Suppression of the cracking by the void can be achieved not only in particular semiconductor devices but also in semiconductor devices in general.

1.2 Outline of Semiconductor Device

FIG. 1 is a schematic view showing a semiconductor device in accordance with the first preferred embodiment. FIG. 1 is a cross section.

The semiconductor device 1000 shown in FIG. 1 is a semiconductor device such as a metal oxide semiconductor field effect transistor (MOSFET), a high electron mobility transistor (HEMT), or the like, and comprises an electrode 1012, a layered body 1014, and a heat dissipation layer 1016. The layered body 1014 comprises a crystalline nitride layer 1022 and a silicon layer 1024. The crystalline nitride layer 1022 comprises an AlGaN layer 1032, a GaN layer 1034, and a GaN buffer layer 1036. The silicon layer 1024 comprises an amorphous portion 1042 and a crystalline portion 1044. The semiconductor device 1000 may comprise any constituent element other than these constituent elements.

The heat dissipation layer 1016 is made of diamond. The amorphous portion 1042 is made of amorphous silicon. The crystalline portion 1044 is made of crystalline silicon. The amorphous portion 1042 serves as a non-inhibiting portion which does not inhibit diamond growth on a surface thereof. The crystalline portion 1044 serves as an inhibiting portion which inhibits the diamond growth on the surface. The silicon layer 1024 is a composite layer consisting of the non-inhibiting portion and the inhibiting portion.

Each of the AlGaN layer 1032 and the GaN layer 1034 is a single crystalline layer. In the crystalline nitride layer 1022, with a heterojunction structure consisting of the AlGaN layer 1032 and the GaN layer 1034, a two-dimensional electron gas is generated in the vicinity of an interface between the AlGaN layer 1032 and the GaN layer 1034. A field effect transistor which can operate with high frequency, carry a large drain current, and perform an output with high output voltage density can be thereby achieved.

The thickness of each of the AlGaN layer 1032, the GaN layer 1034, and the GaN buffer layer 1036 is preferably not smaller than several ten nm and not larger than several μm.

The layers constituting the crystalline nitride layer 1022 may be changed. For example, an AlN layer sandwiched between the GaN buffer layer 1036 and the silicon layer 1024 may be added to the crystalline nitride layer 1022. In the case where the AlN layer is added, the adhesion between the crystalline nitride layer 1022 and the silicon layer 1024 is improved. The GaN buffer layer 1036 may be omitted from the crystalline nitride layer 1022. In the case where the GaN buffer layer 1036 is omitted, the GaN layer 1034 which generates high heat is brought closer to the heat dissipation layer 1016, and the heat dissipation performance of the semiconductor device 1000 is improved.

One main surface (crystalline nitride layer main surface) 1052 of the crystalline nitride layer 1022 faces the heat dissipation layer 1016. On the main surface 1052, the silicon layer 1024 is formed. One main surface (composite layer main surface) 1062 of the silicon layer 1024 faces the heat dissipation layer 1016. On the main surface 1062, the heat dissipation layer 1016 is formed. The heat dissipation layer 1016 is opposed to the main surface 1052 with the silicon layer 1024, a void 1072, and another void 1074 interposed therebetween.

On the other main surface 1054 of the crystalline nitride layer 1022, the electrode 1012 is formed. The electrode 1012 comprises a source electrode, a drain electrode, and a gate electrode, to thereby constitute a device layer which is required to make the semiconductor device 1000 function as a MOSFET, a HEMT, or the like. Therefore, depending on the type of the semiconductor device 1000, the device layer formed of the electrode 1012 is replaced with another device layer.

The gate electrode has an elongated rectangular planar shape. The width of the gate electrode is typically not smaller than 0.1 μm and not larger than 10 μm. The length of the gate electrode is typically not smaller than 10 μm and not larger than 1000 μm. The gate electrode having an elongated rectangular planar shape may be replaced with another gate electrode having a planar shape which is not elongated rectangular.

The other main surface 1082 of the heat dissipation layer 1016 is not opposed to the layered body 1014. On the main surface 1082, a film may be formed. In the case where the film is formed on the main surface 1082, the strength of the semiconductor device 1000 is improved. The film is preferably made of a metal or an alloy having a high conductivity.

1.3 Improvement of Heat Dissipation Performance and Suppression of Cracking

A region 1092 of the one main surface 1052 of the crystalline nitride layer 1022 is not covered with the silicon layer 1024 and forms one main surface 1102 of the layered body 1014. In the region 1092, the GaN buffer layer 1036 is exposed. A region (covered region) 1094 of the main surface 1052 is covered with the silicon layer 1024.

The one main surface 1062 of the silicon layer 1024 forms the one main surface 1102 of the layered body 1014. The silicon layer 1024 is subdivided into the amorphous portion 1042 and the crystalline portion 1044. The amorphous portion 1042 and the crystalline portion 1044 are formed in different regions on the one main surface 1052 of the crystalline nitride layer 1022, and arranged in a distributed manner on the main surface 1052. For this reason, the one main surface 1062 of the silicon layer 1024 has a region 1122 in which the amorphous portion 1042 is exposed and another region 1124 in which the crystalline portion 1044 is exposed.

The one main surface (layered body main surface) 1102 of the layered body 1014, which faces the heat dissipation layer 1016, has the region (first region) 1122 in which the amorphous portion 1042 is exposed, the region (second region) 1124 in which the crystalline portion 1044 is exposed, and the region (third region) 1092 in which the GaN buffer layer 1036 is exposed and the crystalline nitride layer 1022 is exposed.

The heat dissipation layer 1016 is opposed to the main surface 1102.

The heat dissipation layer 1016 is adhered to the region 1122. The heat can be thereby propagated with high efficiency from the crystalline nitride layer 1022 to the heat dissipation layer 1016 through the amorphous portion 1042, and the heat generated in the crystalline nitride layer 1022 can be escaped with high efficiency. Therefore, the heat dissipation performance of the semiconductor device 1000 is improved.

The heat dissipation layer 1016 is separated from the region 1124 with the void (first void) 1072 interposed therebetween, and separated from the region 1092 with the void (second void) 1074 interposed therebetween. The stress caused by great difference between the linear expansion coefficient of the heat dissipation layer 1016 and that of the crystalline nitride layer 1022 can be thereby relieved by the voids 1072 and 1074, and it is possible to suppress cracking in the crystalline nitride layer 1022.

FIG. 2 is a view showing a planar arrangement of the amorphous portion and the voids included in the semiconductor device in accordance with the first preferred embodiment.

The amorphous portion 1042 comprises six sub portions 1132, 1134, 1136, 1138, 1140, and 1142 which are separated from one another. For this reason, the region 1122 in which the amorphous portion 1042 is exposed has six sub regions 1152, 1154, 1156, 1158, 1160, and 1162 which are separated from one another. The six sub portions 1132, 1134, 1136, 1138, 1140, and 1142 are exposed in the six sub regions 1152, 1154, 1156, 1158, 1160, and 1162, respectively. The heat dissipation layer 1016 is adhered to each of the six sub regions 1152, 1154, 1156, 1158, 1160, and 1162. Six interfaces separated from one another, each of which serves as an interface between the silicon layer 1024 and the heat dissipation layer 1016, are thereby formed and the differential shrinkage in each of the six interfaces becomes smaller. Therefore, the cracking of the crystalline nitride layer 1022 can be further suppressed.

Each of the six sub portions 1132, 1134, 1136, 1138, 1140, and 1142 has an elongated rectangular planar shape. The longitudinal direction of each of the six sub portions 1132, 1134, 1136, 1138, 1140, and 1142 coincides with the longitudinal direction of the gate electrode having the elongated rectangular planar shape. The heat dissipation performance of the semiconductor device 1000 is thereby improved. Each of the six sub portions 1132, 1134, 1136, 1138, 1140, and 1142 may be replaced with a sub portion having an elongated shape which is not elongated rectangular. For example, each of the six sub portions 1132, 1134, 1136, 1138, 1140, and 1142 may be replaced with a sub portion having an elongated elliptical planar shape. Depending on the planar shape of the gate electrode, each of the six sub portions 1132, 1134, 1136, 1138, 1140, and 1142 may be replaced with a sub portion having a planar shape which is not an elongated shape.

The six sub portions 1132, 1134, 1136, 1138, 1140, and 1142 are arranged in a lateral direction of each of the six sub portions 1132, 1134, 1136, 1138, 1140, and 1142.

The area of each of the six sub regions 1152, 1154, 1156, 1158, 1160, and 1162 is preferably not smaller than 0.01 mm$^2$ and not larger than 100 mm$^2$, and more preferably not smaller than 0.1 mm$^2$ and not larger than 10 mm$^2$. If the area is smaller than these ranges, there is a tendency that the heat generated in the crystalline nitride layer 1022 is not propagated in a spreading direction of the heat dissipation layer 1016 with high efficiency and it becomes harder to improve the heat dissipation performance of the semiconductor device 1000. If the area is larger than these ranges, there is a tendency that the stress caused by great difference between the linear expansion coefficient of the heat dissipation layer 1016 and that of the crystalline nitride layer 1022 becomes larger in a planar region in which each of the six sub portions 1132, 1134, 1136, 1138, 1140, and 1142 is arranged, and it becomes harder to suppress the cracking of the crystalline nitride layer 1022.

The interval of two adjacent sub portions 1182 and 1184, i.e., the width of the void 1072 or 1074, is preferably not smaller than 10 μm and not larger than 100 μm. If the interval is smaller than this range, there is a tendency that the stress caused by great difference between the linear expansion coefficient of the heat dissipation layer 1016 and that of the crystalline nitride layer 1022 cannot be relieved sufficiently. If the interval is larger than this range, there is a tendency that it becomes harder to form the continuous heat dissipation layer 1016 by chemical vapor deposition (CVD) method. This point will be described in detail in the section "1.5 Relation between Interval between Two Adjacent Sub Portions and Diamond to be Deposited".

The six sub portions 1132, 1134, 1136, 1138, 1140, and 1142 are preferably arranged collectively in the vicinity of the planar region in which the gate electrode is arranged. The heat generation of a GaN channel formed in the GaN layer 1034 becomes the largest in the vicinity of the planar region in which the gate electrode is arranged. For this reason, in a case where the six sub portions 1132, 1134, 1136, 1138, 1140, and 1142 which serve as a heat dissipation path from the GaN channel to the heat dissipation layer 1016 are arranged collectively in the vicinity of the planar region in which the gate electrode is arranged, the heat dissipation is performed with high efficiency and the heat dissipation performance of the semiconductor device 1000 is improved.

The silicon layer 1024 is partitioned at a planar position in which the void 1072 is arranged and at a planar position in which the void 1074 is arranged. The heat dissipation layer 1016 is, however, a continuous layer and is not partitioned at any one of these planar positions. In a case where the heat dissipation layer 1016 is not partitioned at any one of these planar positions, the heat dissipation layer 1016 efficiently propagates the heat in its spreading direction and the heat dissipation layer 1016 serves as an excellent heat spreader. On the other hand, in a case where the heat dissipation layer 1016 is partitioned at any one of these planar positions, the stress is not propagated from one to the other of the two adjacent adhesion portions included in the heat dissipation layer 1016, and the stress occurring in each of a plurality of adhesion portions becomes smaller. There is sometimes a case, however, where the heat dissipation layer 1016 does not efficiently propagate the heat in its spreading direction and the heat dissipation layer 1016 does not serve as an excellent heat spreader.

As shown in FIG. 1, a tip portion 1220 of the void 1072 is arranged between an adhesion portion 1212 and another adhesion portion 1214 which are included in the heat dissipation layer 1016 and adjacent to each other, and tapers as it goes toward the tip 1222. For this reason, when the GaN layer 1034 greatly shrinks and a stress which makes the adhesion portion 1212 closer to the adhesion portion 1214 occurs in the heat dissipation layer 1016, the tip portion 1220 of the void 1072 further tapers and occurrence of the warp is suppressed. The same applies to the void 1074.

Figure 3:
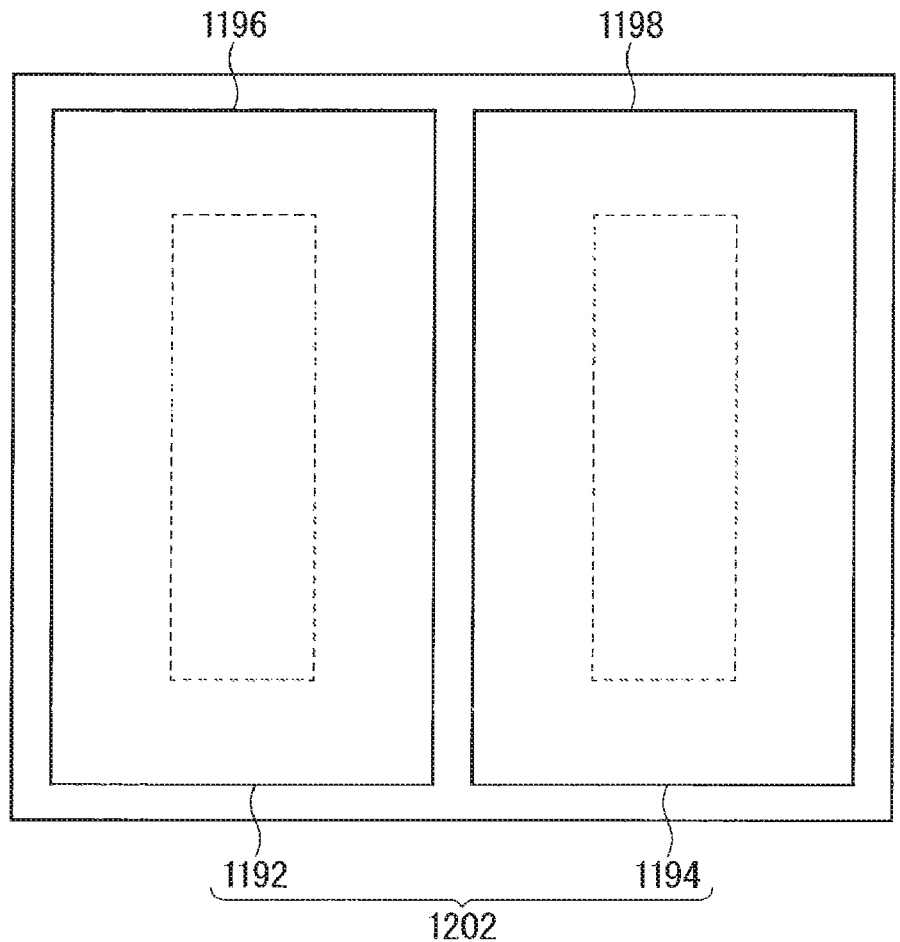
FIG. 3 is a view showing another planar arrangement of the amorphous portion and the voids included in the semiconductor device in accordance with the first, second, third, and fourth preferred embodiments.

FIG. 3 is a view showing another exemplary planar arrangement of the amorphous portion and the voids included in the semiconductor device in accordance with the first preferred embodiment.

The amorphous portion 1042 consisting of the six sub portions 1132, 1134, 1136, 1138, 1140, and 1142 may be replaced with an amorphous portion consisting of five or less sub portions or seven or more sub portions. For example, the amorphous portion 1042 may be replaced with an amorphous portion 1202 consisting of two sub portions 1192 and 1194 shown in FIG. 3. The sub portions 1192 and 1194 are exposed in sub regions 1196 and 1198, respectively. In the case where the amorphous portion 1042 is replaced with the amorphous portion 1202, the heat dissipation layer 1016 is adhered to each of the two sub regions 1196 and 1198.

The linear expansion coefficient of the silicon layer 1024 disposed between the GaN layer 1034 and the heat dissipation layer 1016 is $2.6 \times 10^{-6}$/K as shown in Table 1, which is a linear expansion coefficient between the linear expansion coefficient of the GaN layer 1034 and that of the heat dissipation layer 1016. For this reason, with the silicon layer 1024, the differential shrinkage in one interface becomes smaller. It is thereby possible to further suppress the cracking of the crystalline nitride layer 1022.

In a case where the crystalline nitride layer 1022 comprises the AlN layer described earlier, the linear expansion coefficient of the AlN layer disposed between the GaN layer 1034 and the heat dissipation layer 1016 is $4.3 \times 10^{-6}$/K as shown in Table 1, which is a linear expansion coefficient between the linear expansion coefficient of the GaN layer 1034 and that of the heat dissipation layer 1016. For this reason, with the AlN layer, the differential shrinkage in one interface becomes smaller. It is thereby possible to further suppress the cracking of the crystalline nitride layer 1022.

In a case where the diamond layer is in entire contact with one main surface of the GaN layer, a thermal stress applied to the GaN layer when the complex consisting of the diamond layer and the GaN layer is cooled from 1000° C. to the room temperature of 25° C. is estimated at 650 MPa by calculation. On the other hand, in a case where the diamond layer is in entire contact with one main surface of the silicon layer, a thermal stress applied to the silicon layer when the complex consisting of the diamond layer and the silicon layer is cooled from 1000° C. to the room temperature of 25° C. is estimated at 90 MPa by calculation. For this reason, in the complex consisting of the diamond layer and the silicon layer, cracking of the silicon layer due to the stress is hard to occur. Therefore, in the semiconductor device 1000, the cracking of the silicon layer 1024 is hard to occur.

In a case where the diamond layer is in entire contact with one main surface of the GaN layer, cracking of the GaN layer occurs when the complex consisting of the diamond layer and the GaN layer is cooled from 850° C. or higher to the room temperature of 25° C. A thermal stress applied to the GaN layer when the complex consisting of the diamond layer and the GaN layer is cooled from 850° C. to the room temperature of 25° C. is estimated at 570 MPa by calculation. Therefore, the cracking of the GaN layer occurs when the thermal stress applied to the GaN layer is not smaller than 570 MPa. The voids 1072 and 1074 formed in the semiconductor device 1000 relieve such a large thermal stress and suppress the cracking of the crystalline nitride layer 1022.

1.4 Method of Manufacturing Semiconductor Device

Figure 4:
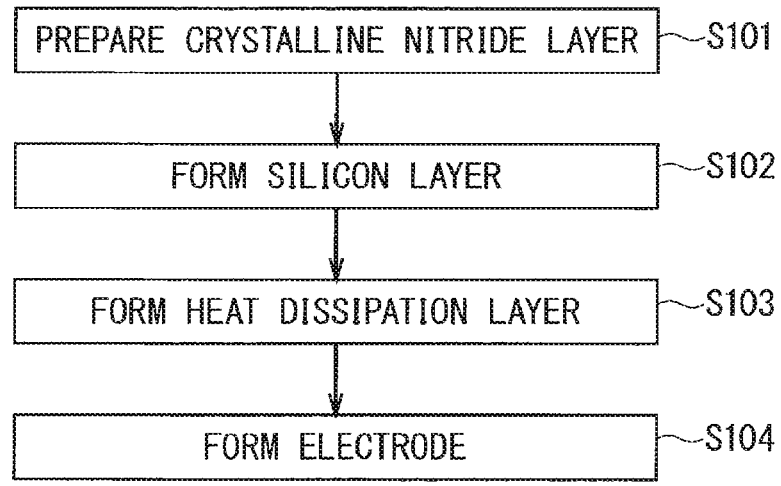
FIG. 4 is a flowchart showing a method of manufacturing the semiconductor device in accordance with the first, second, and third preferred embodiments.

FIG. 4 is a flowchart showing a method of manufacturing the semiconductor device in accordance with the first preferred embodiment. FIGS. 5, 6, 7, and 8 are schematic views each showing a work-in-process of the semiconductor device in accordance with the first preferred embodiment. FIGS. 5, 6, 7, and 8 are cross sections.

In a case where diamond is grown by microwave plasma CVD method, diamond is easier to grow when the base material is silicon than when the base material is a group III nitride. Further, diamond is easier to densely grow when the base material is amorphous silicon than when the base material is crystalline silicon. In a case where the base material is amorphous silicon, no void is formed between the grown diamond and the base and the diamond is adhered to the base. In the method of manufacturing the semiconductor device 1000 in accordance with the first preferred embodiment, in a case where the voids 1072 and 1074 are formed between the layered body 1014 and the heat dissipation layer 1016, this characteristic feature is used in order to form the voids 1072 and 1074 each having a desired size at desired positions. In other words, in a region to which the heat dissipation layer 1016 is adhered, the amorphous silicon is exposed, and in regions in which the voids 1072 and 1074 are formed, the crystalline silicon and the group III nitride are exposed, respectively.

Figure 5:
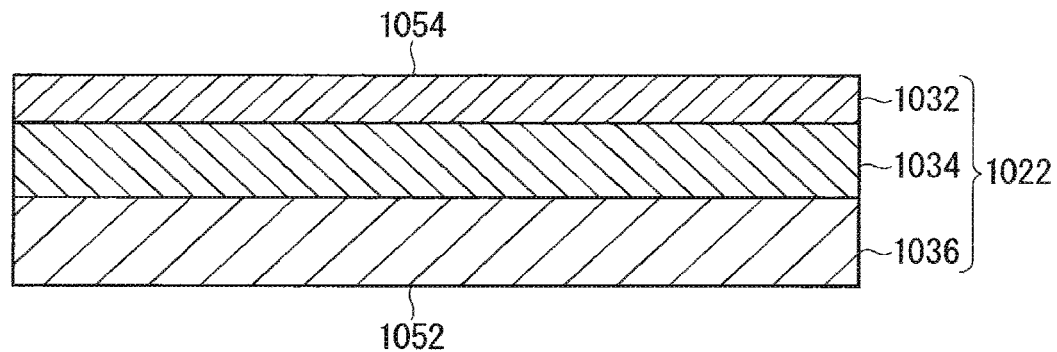
FIG. 5 is a cross section showing a work-in-process of the semiconductor device in accordance with the first preferred embodiment.

In Step S101 shown in FIG. 4, the crystalline nitride layer 1022 shown in FIG. 5 is prepared.

In a case where the crystalline nitride layer 1022 is prepared, the GaN buffer layer 1036, the GaN layer 1034, and the AlGaN layer 1032 are epitaxially grown on one main surface of a silicon substrate in the described order, and the crystalline nitride layer 1022 consisting of the epitaxially grown GaN buffer layer 1036, GaN layer 1034, and AlGaN layer 1032 is separated from the silicon substrate. The silicon substrate may be replaced with any other kind of substrate. For example, the silicon substrate may be replaced with a silicon carbide substrate. The epitaxial growth is performed by metal-organic chemical vapor deposition (MOCVD) method. In a case where the crystalline nitride layer 1022 is separated from the silicon substrate, the other main surface 1054 of the crystalline nitride layer 1022 is temporarily adhered to another silicon substrate, and the original silicon substrate coupled to the one main surface 1052 of the crystalline nitride layer 1022 is removed by grinding, polishing, and etching. The silicon substrate which is temporarily adhered to the main surface 1054 may be replaced with another supporting substrate. In the case where the GaN buffer layer 1036 is omitted from the crystalline nitride layer 1022, the GaN buffer layer 1036 together with the silicon substrate coupled to the main surface 1052 is removed by etching.

In Step S102 shown in FIG. 4, the silicon layer 1024 is formed.

Figure 6:
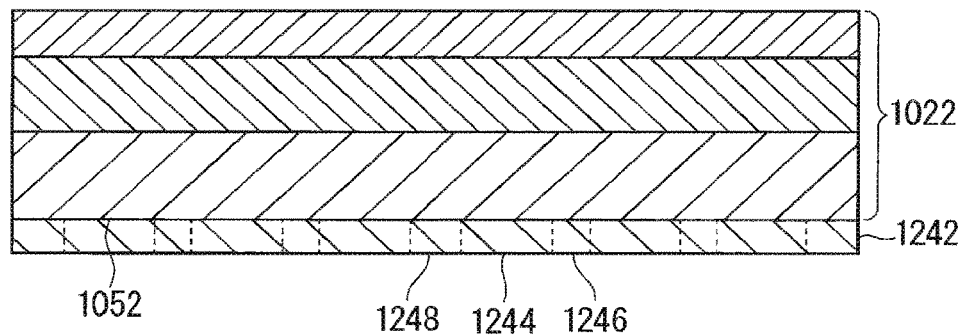
FIG. 6 is a cross section showing another work-in-process of the semiconductor device in accordance with the first preferred embodiment.
Figure 7:
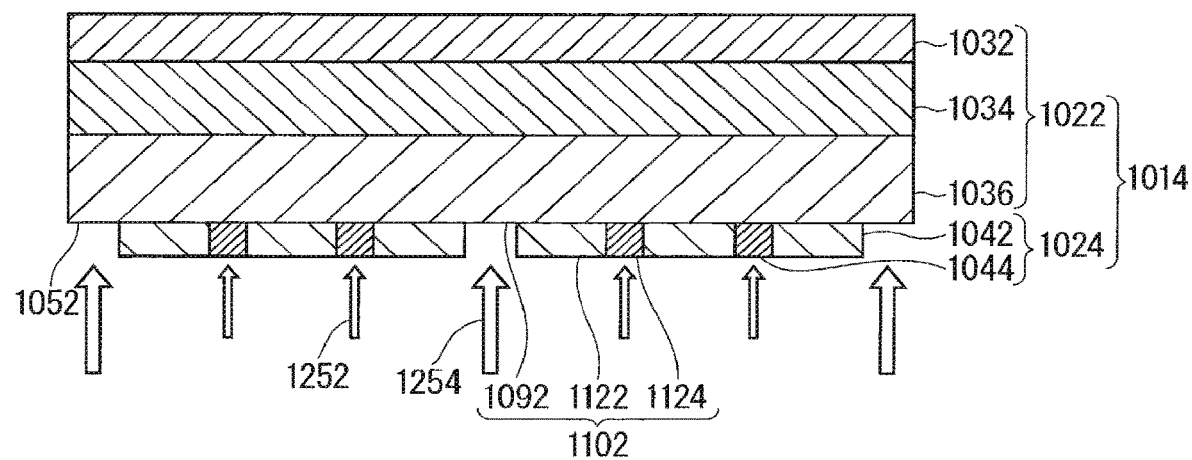
FIG. 7 is a cross section showing still another work-in-process of the semiconductor device in accordance with the first preferred embodiment.

In a case where the silicon layer 1024 is formed, the one main surface 1052 of the crystalline nitride layer 1022 is entirely covered with an amorphous silicon layer 1242 shown in FIG. 6, and the silicon layer 1024 shown in FIG. 7 is produced from the amorphous silicon layer 1242.

In a process where the main surface 1052 is covered with the amorphous silicon layer 1242, a mixed gas of SiH$_4$ gas and H$_2$ gas is used as a material, and the amorphous silicon is deposited on the main surface 1052 by radio-frequency plasma CVD method. An underlying layer for forming diamond is thereby formed.

In a process where the silicon layer 1024 is produced from the amorphous silicon layer 1242, a second portion 1246 included in the amorphous silicon layer 1242 is irradiated with a medium-intensity laser beam 1252 and a third portion 1248 included in the amorphous silicon layer 1242 is irradiated with a high-intensity laser beam 1254 so that a first portion 1244 included in the amorphous silicon layer 1242 should not be irradiated with any laser beam. With this irradiation, the first portion 1244 made of amorphous silicon becomes the amorphous portion 1042 made of amorphous silicon without any change, the second portion 1246 made of amorphous silicon is crystallized and changed into the crystalline portion 1044 made of crystalline silicon, and the third portion 1248 is removed. With removal of the third portion 1248, the one main surface 1102 of the layered body 1014 has the region 1092 in which the GaN buffer layer 1036 is exposed.

The intensity (second intensity) of the laser beam 1254 is higher than the intensity (first intensity) of the laser beam 1252. The wavelength of each of the laser beams 1252 and 1254 is selected so that each laser beam should be absorbed by amorphous silicon but hardly absorbed by GaN. Each laser beam is typically a second harmonic beam of yttrium aluminum garnet (YAG) laser.

In the case where the second portion 1246 is irradiated with the medium-intensity laser beam 1252, the entire second portion 1246 is scanned at the irradiation point of the medium-intensity laser beam 1252. In the case where the third portion 1248 is irradiated with the high-intensity laser beam 1254, the entire third portion 1248 is scanned at the irradiation point of the high-intensity laser beam 1254.

In Step S102, a main portion of the one main surface 1052 of the crystalline nitride layer 1022 is covered with the silicon layer 1024 comprising the amorphous portion 1042 and the crystalline portion 1044, and the layered body 1014 is obtained, which has the main surface 1102 having the region 1122 in which the amorphous portion 1042 is exposed, the region 1124 in which the crystalline portion 1044 is exposed, and the region 1092 in which the crystalline nitride layer 1022 is exposed.

Figure 8:
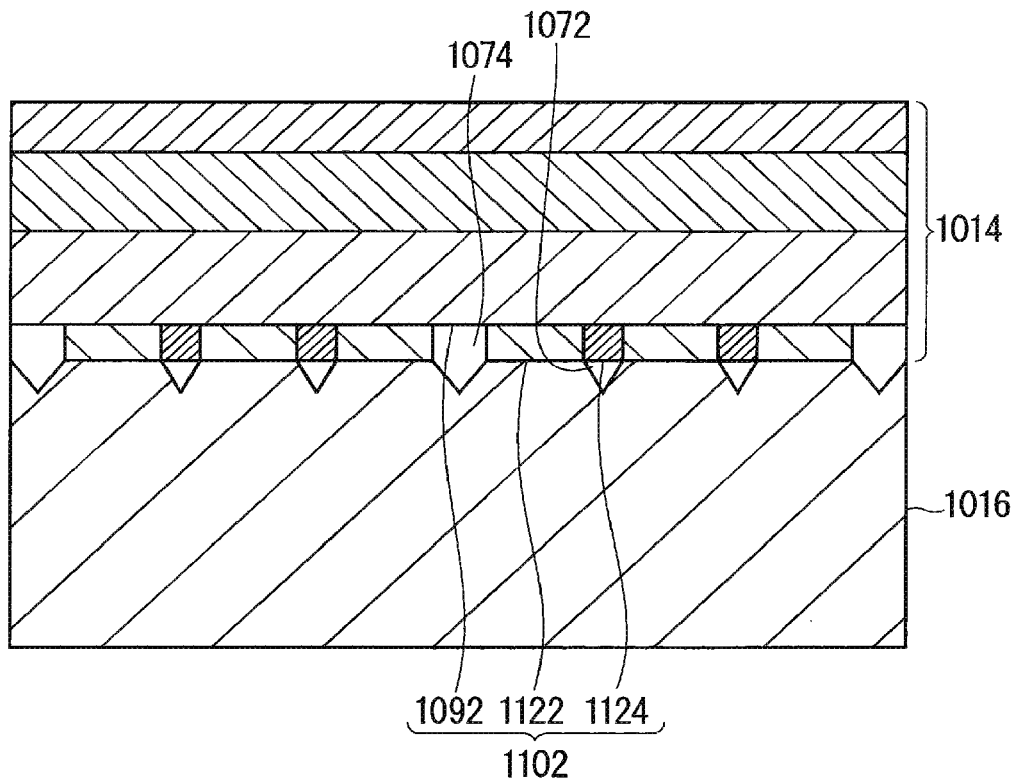
FIG. 8 is a cross section showing yet another work-in-process of the semiconductor device in accordance with the first preferred embodiment.

In Step S103 shown in FIG. 4, the heat dissipation layer 1016 shown in FIG. 8 is formed.

In the case where the heat dissipation layer 1016 is formed, a growth nucleus of diamond is formed on the one main surface 1102 of the layered body 1014 and the diamond is deposited on the main surface 1102.

In the case where the growth nucleus of diamond is formed, a dispersion liquid in which fine particles of diamond are dispersed in pure water is prepared, and the layered body 1014 is immersed in the prepared dispersion liquid and an ultrasonic wave is applied, for thirty minutes, to the dispersion liquid in which the layered body 1014 is immersed.

The particle diameter of the fine particles of diamond to be dispersed in the pure water is preferably not smaller than 2 nm and not larger than 10 nm. The power density of the ultrasonic wave to be applied is preferably not smaller than 0.5 W/cm$^2$ and not larger than 5 W/cm$^2$. With this operation, the growth nucleus of diamond is formed selectively on the regions 1122 and 1124, and no growth nucleus of diamond is formed on the regions 1092.

In the case where diamond is deposited, a mixed gas of CH$_4$ gas, H$_2$ gas, and O$_2$ gas is used as a material, and the diamond is deposited by the microwave plasma CVD method. The diamond is deposited only on the region 1122 and not deposited on the regions 1124 and 1092. With this deposition, obtained is the heat dissipation layer 1016 which is made of diamond, opposed to the one main surface 1102 of the layered body 1014, adhered to the region 1122, and separated from the region 1124 with the void 1072 interposed therebetween and separated from the region 1092 with the void 1074 interposed therebetween.

In the case where the diamond is deposited by the microwave plasma CVD method, typically, the flow rate of the CH$_4$ gas is set to 50 sccm, the flow rate of the H$_2$ gas is set to 500 sccm, and the flow rate of the O$_2$ gas is set to 10 sccm, the pressure is set to 13.3 kPa, the temperature is set to 1000° C., and the power of microwave is set to 5 kW. The diamond to be deposited is polycrystalline diamond. The grain diameter of crystals forming the polycrystalline diamond is typically not smaller than 2 μm and not larger than 100 μm. The crystal diameter may be made larger. In order to make the crystal diameter larger, the density of the growth nucleus of diamond to be formed on the one main surface 1102 of the layered body 1014 is made lower. In order to make the density of the growth nucleus of diamond lower, the time for applying the ultrasonic wave is shortened.

The diamond may be deposited by any CVD method other than the microwave plasma CVD method. For example, the diamond may be deposited by hot filament CVD method. In the case where the diamond is deposited by the microwave plasma CVD method, the material is heated by the energy of the microwave and the gas contained in the material is decomposed. In the case where the diamond is deposited by the hot filament CVD method, the material is heated by the heat emitted from an energized filament and the gas contained in the material is decomposed. In the case where the diamond is deposited by the hot filament CVD method, the temperature is preferably set to not lower than 1500° C. and not higher than 3000° C. If the temperature is lower than this range, there is a tendency that the decomposition of the gas is insufficiently performed. If the temperature is higher than this range, there is sometimes a case where the filament made of tungsten cannot resist the heat.

In Step S104 shown in FIG. 4, the electrode 1012 is formed and the semiconductor device 1000 shown in FIG. 1 is achieved. The electrode 1012 is formed by sputtering or the like.

1.5 Relation Between Interval Between Two Adjacent Sub Portions and Diamond to be Deposited FIGS. 9, 10, 11, and 12 each show the sub portions of the amorphous portion, diamond, and the like formed on the crystalline nitride layer included in the semiconductor device in accordance with the first preferred embodiment. FIGS. 9, 10, 11, and 12 are each a schematic view and a cross section.

In the semiconductor devices shown in FIGS. 9, 10, 11, and 12, the interval between the two adjacent sub portions 1262 and 1264 is 100 µm, 50 µm, 30 µm, and 10 µm, respectively. In the semiconductor device shown in each of FIGS. 9, 10, 11, and 12, the planar shape of each of the sub portions 1262, 1264, and the like included in the amorphous portion is a square and the planar shape of the crystalline portion 1266 is like a lattice. The width of each of the sub portions 1262, 1264, and the like is equal to that of the crystalline portion 1266.

Figure 9:
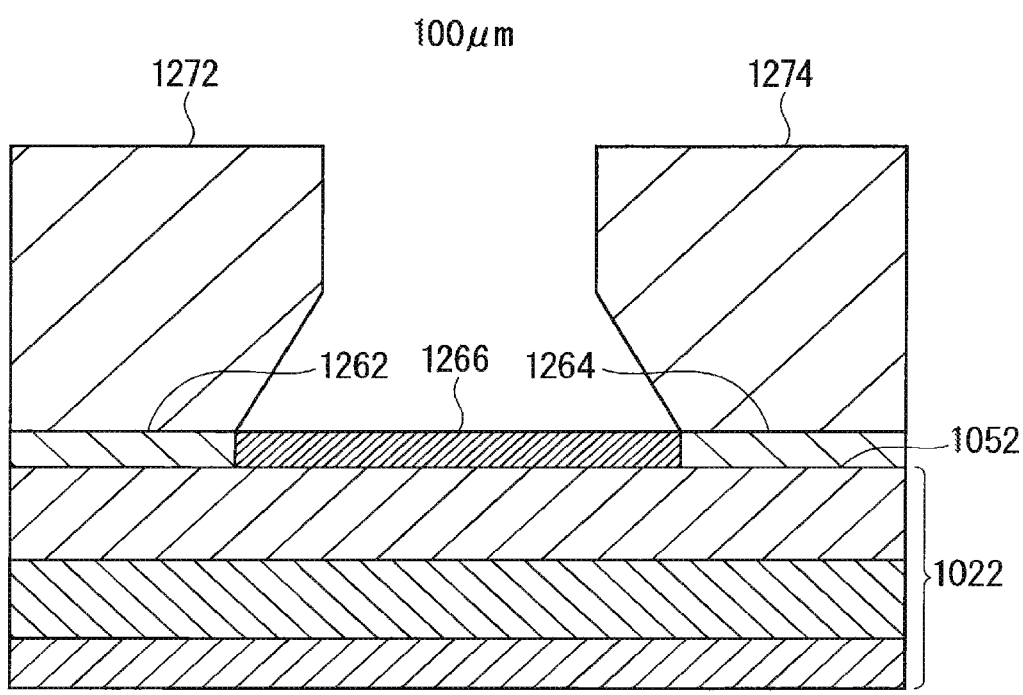
FIG. 9 is a cross section showing sub portions of the amorphous portion, diamond, and the like formed on a crystalline nitride layer included in the semiconductor device in accordance with the first preferred embodiment.

In the case where the interval between the two adjacent sub portions 1262 and 1264 is 100 µm as shown in FIG. 9, diamonds 1272 and 1274 are deposited on the sub portions 1262 and 1264, respectively. Each of the diamonds 1272 and 1274 is spread in a direction parallel to the one main surface 1052 of the crystalline nitride layer 1022. The diamonds 1272 and 1274, however, are not adhered to each other, and any continuous layer made of diamond is not formed.

Figure 10:
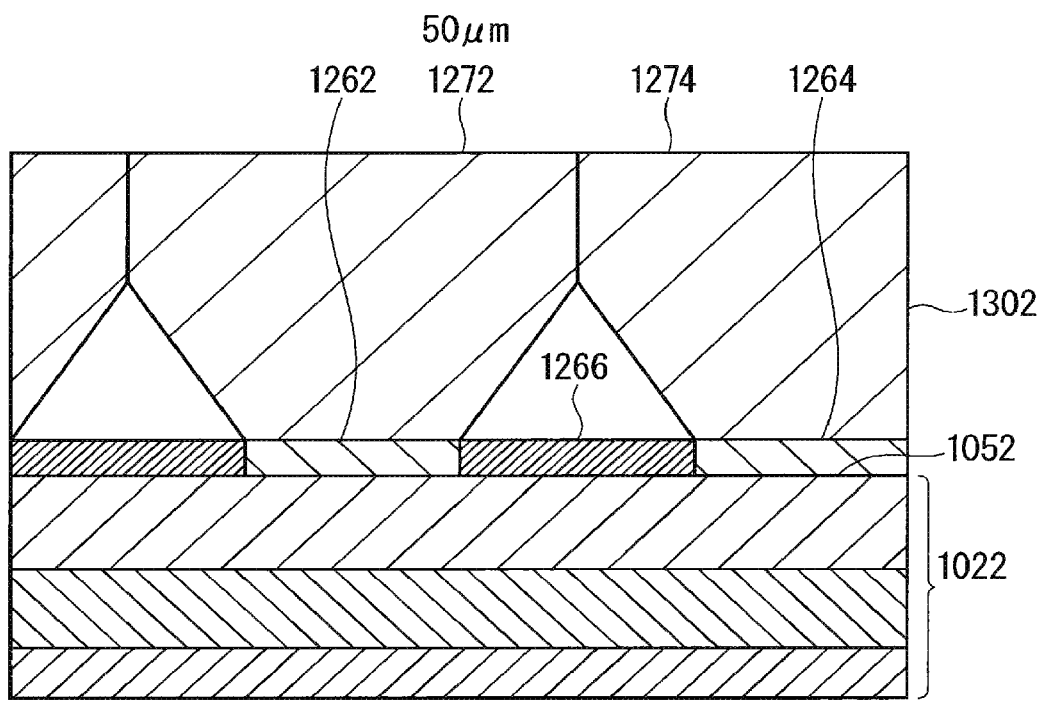
FIG. 10 is another cross section showing the sub portions of the amorphous portion, diamond, and the like formed on the crystalline nitride layer included in the semiconductor device in accordance with the first preferred embodiment.
Figure 11:
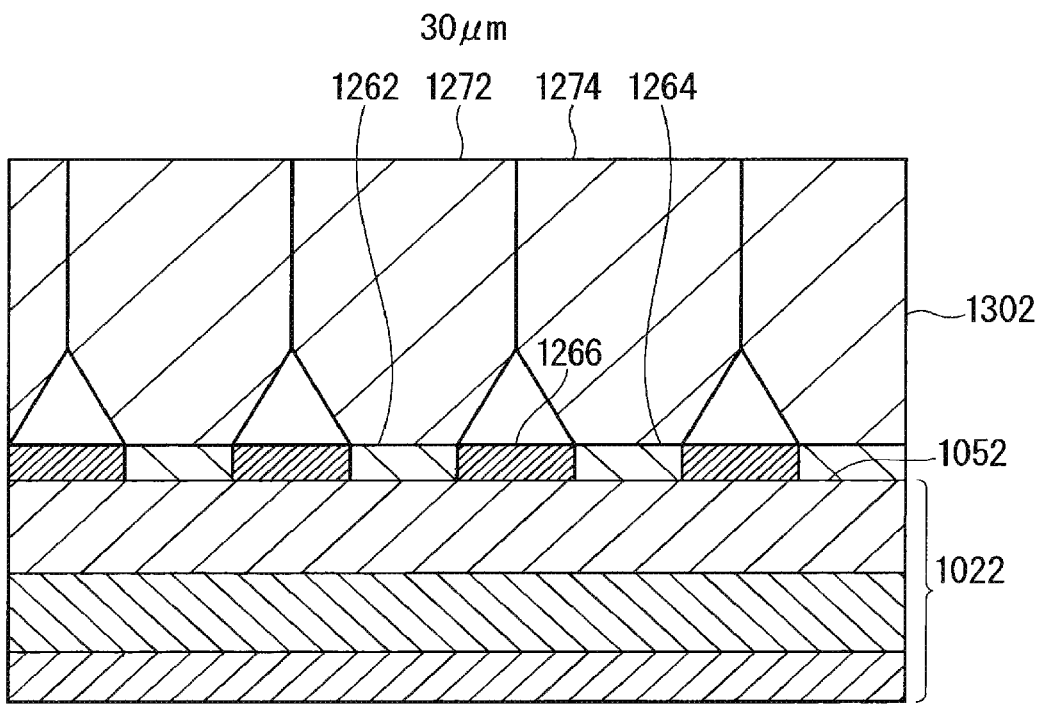
FIG. 11 is still another cross section showing the sub portions of the amorphous portion, diamond, and the like formed on the crystalline nitride layer included in the semiconductor device in accordance with the first preferred embodiment.

Also in the case where the interval between the two adjacent sub portions 1262 and 1264 is 50 µm, 30 µm, or 10 µm as shown in FIG. 10, 11 or 12, respectively, the diamonds 1272 and 1274 are deposited on the sub portions 1262 and 1264, respectively. Further, each of the diamonds 1272 and 1274 is spread in the direction parallel to the one main surface 1052 of the crystalline nitride layer 1022. Furthermore, the diamonds 1272 and 1274 are adhered to each other, and a continuous layer 1302 made of diamond is formed. The continuous layer 1302 serves as an excellent heat spreader which propagates heat in its spreading direction with high efficiency.

If the interval between the two adjacent sub portions 1262 and 1264 is narrower than 10 µm, however, the diamonds 1272 and 1274 are adhered to each other in the very close vicinity of the sub portions 1262 and 1264, and a void 1312 becomes smaller. For this reason, there arises a tendency that the stress is relieved insufficiently by the void 1312.

From these points, as described earlier, the interval between the two adjacent sub portions is preferably not smaller than 10 µm and not larger than 100 µm.

1.6 Inventions Included in the First Preferred Embodiment

According to the above description, the first preferred embodiment includes the first to seventh inventions relating to the semiconductor device 1000 described below, and includes the eighth and ninth inventions relating to the method of manufacturing the semiconductor device 1000 described below.

(The First Invention) The semiconductor device 1000 comprises the layered body 1014 and the heat dissipation layer 1016.

The layered body 1014 comprises the crystalline nitride layer 1022 and the composite layer 1024. The composite layer 1024 comprises the non-inhibiting portion 1042 which does not inhibit diamond growth on a surface thereof and the inhibiting portion 1044 which inhibits the diamond growth on the surface. The layered body main surface 1102 of the layered body 1014 has the first region 1122 in which the non-inhibiting portion 1042 is exposed and the second region 1124 in which the inhibiting portion 1044 is exposed.

The heat dissipation layer 1016 is made of diamond, opposed to the layered body main surface 1102, adhered to the first region 1122, and separated from the second region 1124 with the void 1072 interposed therebetween.

(The Second Invention) In the first invention, the non-inhibiting portion 1042 is made of amorphous silicon.

(The Third Invention) In the first or second invention, the inhibiting portion 1044 is made of crystalline silicon.

(The Fourth Invention) In any one of the first to third inventions, the first region 1122 comprises the plurality of sub regions 1152, 1154, 1156, 1158, 1160, and 1162 which are separated from one another or the plurality of sub regions 1196 and 1198 which are separated from each other. The heat dissipation layer 1016 is adhered to each of the plurality of sub regions 1152, 1154, 1156, 1158, 1160, and 1162 or each of the plurality of sub regions 1196 and 1198.

(The Fifth Invention) In any one of the first to fourth inventions, the void 1072 is the first void 1072. The layered body main surface 1102 further has the third region 1092 in which the crystalline nitride layer 1022 is exposed. The heat dissipation layer 1016 is separated from the third region 1092 with the second void 1074 interposed therebetween.

(The Sixth Invention) In the fifth invention, the crystalline nitride layer 1022 has the crystalline nitride layer main surface 1052 facing the heat dissipation layer 1016. The crystalline nitride layer main surface 1052 has the third region 1092 and the covered region 1094 covered with the composite layer 1024. The composite layer 1024 has the composite layer main surface 1062 facing the heat dissipation layer 1016. The composite layer main surface 1062 has the first region 1122 and the second region 1124.

(The Seventh Invention) In any one of the first to sixth inventions, the crystalline nitride layer 1022 has the crystalline nitride layer main surface 1052 facing the heat dissipation layer 1016. The non-inhibiting portion 1042 and the inhibiting portion 1044 are formed in different regions on the crystalline nitride layer main surface 1052.

(The Eighth Invention) The method of manufacturing the semiconductor device 1000 comprises Steps S101, S102, and S103.

In Step S101, the crystalline nitride layer 1022 having the crystalline nitride layer main surface 1052 is prepared.

In Step S102, the crystalline nitride layer main surface 1052 is covered with the composite layer 1024 comprising the non-inhibiting portion 1042 which does not inhibit diamond growth on the surface thereof and the inhibiting portion 1044 which inhibits the diamond growth on the surface. The layered body 1014 comprising the crystalline nitride layer 1022 and the composite layer 1024 is thereby obtained. The layered body main surface 1102 of the layered body 1014 has the first region 1122 in which the non-inhibiting portion 1042 is exposed and the second region 1124 in which the inhibiting portion 1044 is exposed.

In Step S103, polycrystalline diamond is deposited on the first region 1122 by the chemical vapor deposition method. The heat dissipation layer 1016 made of the polycrystalline diamond is thereby formed. The heat dissipation layer 1016 is opposed to the layered body main surface 1102, adhered to the first region 1122, and separated from the second region 1124 with the void 1072 interposed therebetween.

(The Ninth Invention) In the eighth invention, the void 1072 is the first void 1072. The non-inhibiting portion 1042 is made of amorphous silicon, and the inhibiting portion 1044 is made of crystalline silicon.

In Step S102, the crystalline nitride layer main surface 1052 is covered with the amorphous silicon layer 1242 comprising the first portion 1244, the second portion 1246, and the third portion 1248. The second portion 1246 is irradiated with the laser beam 1252 having the first intensity and the third portion 1248 is irradiated with the laser beam 1254 having the second intensity higher than the first intensity. With this irradiation, the first portion 1244 becomes the non-inhibiting portion 1042, the second portion 1246 is changed to the inhibiting portion 1044, and the third portion 1248 is removed. The layered body main surface 1102 has the third region 1092 in which the crystalline nitride layer 1022 is exposed.

In Step S103, the heat dissipation layer 1016 is formed so that the heat dissipation layer 1016 should be separated from the third region 1092 with the second void 1074 interposed therebetween.

According to the inventions included in the first preferred embodiment, the stress caused by great difference between the linear expansion coefficient of the heat dissipation layer 1016 and that of the crystalline nitride layer 1022 is relieved by the voids 1072 and 1074, and it is thereby possible to suppress the cracking of the crystalline nitride layer 1022. Further, according to the fourth invention, the plurality of interfaces separated from one another, each of which serves as the interface between the composite layer 1024 and the heat dissipation layer 1016, are formed, and the differential shrinkage in each of the plurality of interfaces thereby becomes smaller and the cracking of the crystalline nitride layer 1022 can be further suppressed.

Figure 13:
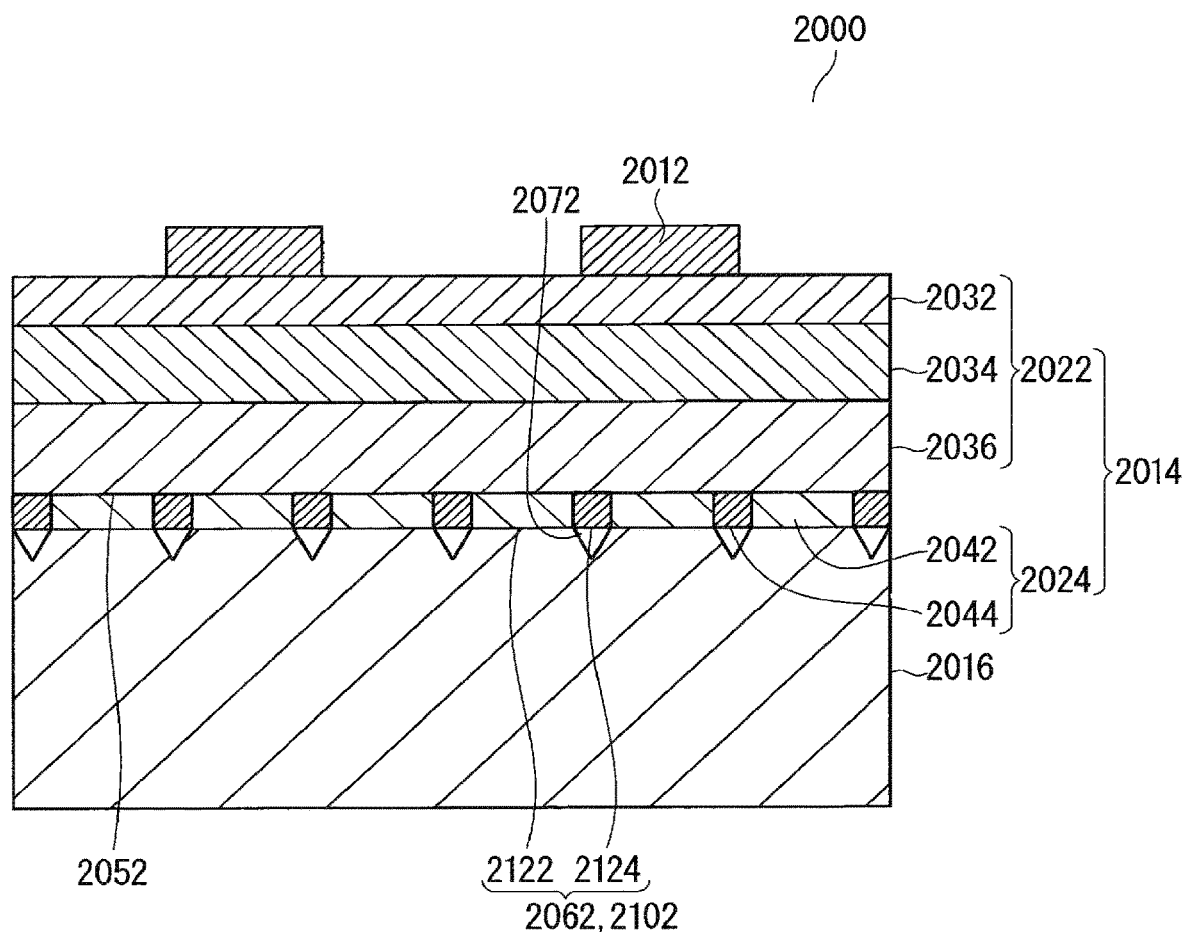
FIG. 13 is a cross section showing a semiconductor device in accordance with the second preferred embodiment.

2. The Second Preferred Embodiment 2.1 Difference from the First Preferred Embodiment FIG. 13 is a schematic view showing a semiconductor device in accordance with the second preferred embodiment. FIG. 13 is a cross section. FIGS. 2 and 3 are also views each showing a planar arrangement of the amorphous portion and the voids included in the semiconductor device in accordance with the second preferred embodiment. FIG. 4 is also a flowchart showing a method of manufacturing the semiconductor device in accordance with the second preferred embodiment.

The semiconductor device 2000 shown in FIG. 13 comprises an electrode 2012, a layered body 2014, and a heat dissipation layer 2016. The layered body 2014 comprises a crystalline nitride layer 2022 and a silicon layer 2024. The crystalline nitride layer 2022 comprises an AlGaN layer 2032, a GaN layer 2034, and a GaN buffer layer 2036. The silicon layer 2024 comprises an amorphous portion 2042 and a crystalline portion 2044. The amorphous portion 2042 serves as a non-inhibiting portion which does not inhibit diamond growth on a surface thereof. The crystalline portion 2044 serves as an inhibiting portion which inhibits the diamond growth on the surface. The silicon layer 2024 is a composite layer consisting of the non-inhibiting portion and the inhibiting portion.

The electrode 2012, the crystalline nitride layer 2022, the AlGaN layer 2032, the GaN layer 2034, and the GaN buffer layer 2036 included in the semiconductor device 2000 of the second preferred embodiment are the same as the electrode 1012, the crystalline nitride layer 1022, the AlGaN layer 1032, the GaN layer 1034, and the GaN buffer layer 1036 included in the semiconductor device 1000 of the first preferred embodiment, respectively. The layered body 2014, the heat dissipation layer 2016, the silicon layer 2024, the amorphous portion 2042, and the crystalline portion 2044 included in the semiconductor device 2000 of the second preferred embodiment are variations of the layered body 1014, the heat dissipation layer 1016, the silicon layer 1024, the amorphous portion 1042, and the crystalline portion 1044 included in the semiconductor device 1000 of the first preferred embodiment, respectively.

Hereinafter, the difference between the first preferred embodiment and the second preferred embodiment will be mainly described. As to the constituent elements not described below, the constituent elements adopted in the first preferred embodiment are also adopted in the second preferred embodiment.

In the semiconductor device 1000 of the first preferred embodiment, the silicon layer 1024 covers the region 1094 which is part of the one main surface 1052 of the crystalline nitride layer 1022, and the crystalline nitride layer 1022 is exposed in the one main surface 1102 of the layered body 1014. On the other hand, in the semiconductor device 2000 of the second preferred embodiment, the silicon layer 2024 entirely covers one main surface 2052 of the crystalline nitride layer 2022, and the crystalline nitride layer 2022 is not exposed in one main surface 2102 of the layered body 2014.

The one main surface (crystalline nitride layer main surface) 2052 of the crystalline nitride layer 2022 faces the heat dissipation layer 2016. On the main surface 2052, the silicon layer 2024 is formed. One main surface (composite layer main surface) 2062 of the silicon layer 2024 faces the heat dissipation layer 2016. On the main surface 2062, the heat dissipation layer 2016 is formed. The heat dissipation layer 2016 is opposed to the main surface 2052 with the silicon layer 2024 and a void 2072 interposed therebetween.

The one main surface 2062 of the silicon layer 2024 forms the one main surface (layered body main surface) 2102 of the layered body 2014. The amorphous portion 2042 and the crystalline portion 2044 are formed in different regions on the one main surface 2052 of the crystalline nitride layer 2022. For this reason, the one main surface 2062 of the silicon layer 2024 has a region 2122 in which the amorphous portion 2042 is exposed and another region 2124 in which the crystalline portion 2044 is exposed.

The one main surface 2102 of the layered body 2014, which faces the heat dissipation layer 2016, thereby has the region (first region) 2122 in which the amorphous portion 2042 is exposed and the region (second region) 2124 in which the crystalline portion 2044 is exposed.

The semiconductor device 2016 is made of diamond and opposed to the main surface 2102.

The heat dissipation layer 2016 is adhered to the region 2122. The heat can be thereby propagated with high efficiency from the crystalline nitride layer 2022 to the heat dissipation layer 2016 through the amorphous portion 2042, and the heat generated in the crystalline nitride layer 2022 can be escaped with high efficiency. Therefore, the heat dissipation performance of the semiconductor device 2000 is improved.

The heat dissipation layer 2016 is separated from the region 2124 with the void 2072 interposed therebetween. The stress caused by great difference between the linear expansion coefficient of the heat dissipation layer 2016 and that of the crystalline nitride layer 2022 can be thereby relieved by the void 2072, and it is possible to suppress cracking in the crystalline nitride layer 2022.

The amorphous portion 2042 comprises six sub portions 1132, 1134, 1136, 1138, 1140, and 1142 which are separated from one another. For this reason, the region 2122 in which the amorphous portion 2042 is exposed has six sub regions 1152, 1154, 1156, 1158, 1160, and 1162 shown in FIG. 2 which are separated from one another. The six sub portions 1132, 1134, 1136, 1138, 1140, and 1142 are exposed in the six sub regions 1152, 1154, 1156, 1158, 1160, and 1162, respectively. The heat dissipation layer 2016 is adhered to each of the six sub regions 1152, 1154, 1156, 1158, 1160, and 1162. The heat dissipation layer 2016 may be adhered to each of the two sub regions 1196 and 1198 shown in FIG. 3.

In a case where the semiconductor device 2000 is manufactured, like in the case where the semiconductor device 1000 is manufactured, in Step S101 shown in FIG. 4, the crystalline nitride layer 2022 is prepared. Further, in Step S102 shown in FIG. 4, the one main surface 2052 of the crystalline nitride layer 2022 is covered with the silicon layer 2024, and the layered body 2014 is thereby obtained. Furthermore, in Step S103 shown in FIG. 4, polycrystalline diamond is deposited on the region 2122 of the one main surface 2102 of the layered body 2014 by the CVD method, and the heat dissipation layer 2016 made of the polycrystalline diamond is thereby formed. In addition, in Step S104 shown in FIG. 4, the electrode 2012 is formed.

In Step S102, however, the one main surface 2052 of the crystalline nitride layer 2022 is entirely covered with an amorphous silicon layer like the amorphous silicon layer 1242 shown in FIG. 6, and a second portion of the amorphous silicon layer is irradiated with a medium-intensity laser beam so that a first portion of the amorphous silicon layer should not be irradiated with any laser beam. With this irradiation, the first portion made of amorphous silicon becomes the amorphous portion 2042 made of amorphous silicon without any change, and the second portion made of amorphous silicon is crystallized and changed into the crystalline portion 2044 made of crystalline silicon.

The irradiation intensity of the laser beam is strictly controlled so that the second portion of the amorphous silicon layer should not be removed and the GaN buffer layer 2036 should not be exposed. This is because it is permitted in the semiconductor device 1000 that the second portion 1246 of the amorphous silicon layer 1242 is removed and the GaN buffer layer 1036 is thereby exposed but it is not permitted in the semiconductor device 2000 that the second portion of the amorphous silicon layer is removed and the GaN buffer layer 2036 is thereby exposed. The irradiation intensity of the laser beam is controlled to be preferably not smaller than 1.0 times the irradiation intensity for crystallization of the amorphous silicon and not larger than 1.1 times. Generally speaking, a distribution of the irradiation intensity of the laser beam is the Gaussian distribution in which the irradiation intensity becomes higher as it goes closer to the center of the beam. For this reason, in a case where the amorphous silicon layer is irradiated with the laser beam, preferably, the distribution of the irradiation intensity of the laser beam is uniformized by a homogenizer.

The crystalline portion 2044 may be formed not through the amorphous silicon. In this case, the amorphous portion 2042 is formed, and the crystalline portion 2044 is formed before or after the amorphous portion 2042 is formed. In a case where each of the amorphous portion 2042 and the crystalline portion 2044 is formed, patterning is performed by using a photoresist, a mask, or the like.

According to the second preferred embodiment, the semiconductor device 2000 can be manufactured by an easy process.

Further, according to the second preferred embodiment, the silicon layer 2024 is in entire contact with the one main surface 2052 of the crystalline nitride layer 2022. For this reason, the thermal conductivity in the interface between the crystalline nitride layer 2022 and the silicon layer 2024 is improved. Furthermore, the one main surface 2102 of the layered body 2014 becomes almost even, the crystallinity of the diamond forming the heat dissipation layer 2016 formed on the main surface 2102 is improved, and the thermal conductivity of the heat dissipation layer 2016 is improved. The heat dissipation performance of the semiconductor device 2000 is thereby improved.

2.2 Inventions Included in the Second Preferred Embodiment

According to the above description, the second preferred embodiment includes the first to seventh inventions relating to the semiconductor device 2000, and includes the eighth and ninth inventions relating to the method of manufacturing the semiconductor device 2000.

(The First Invention) The semiconductor device 2000 comprises the layered body 2014 and the heat dissipation layer 2016.

The layered body 2014 comprises the crystalline nitride layer 2022 and the composite layer 2024. The composite layer 2024 comprises the non-inhibiting portion 2042 which does not inhibit diamond growth on a surface thereof and the inhibiting portion 2044 which inhibits the diamond growth on the surface. The layered body main surface 2102 of the layered body 2014 has the first region 2122 in which the non-inhibiting portion 2042 is exposed and the second region 2124 in which the inhibiting portion 2044 is exposed.

The heat dissipation layer 2016 is made of diamond, opposed to the layered body main surface 2102, adhered to the first region 2122, and separated from the second region 2124 with the void 2072 interposed therebetween.

(The Second Invention) In the first invention, the non-inhibiting portion 2042 is made of amorphous silicon.

(The Third Invention) In the first or second invention, the inhibiting portion 2044 is made of crystalline silicon.

(The Fourth Invention) In any one of the first to third inventions, the first region 2122 comprises the plurality of sub regions 1152, 1154, 1156, 1158, 1160, and 1162 which are separated from one another or the plurality of sub regions 1196 and 1198 which are separated from each other. The heat dissipation layer 2016 is adhered to each of the plurality of sub regions 1152, 1154, 1156, 1158, 1160, and 1162 or each of the plurality of sub regions 1196 and 1198.

(The Fifth Invention) In any one of the first to fourth inventions, the crystalline nitride layer 2022 is not exposed in the layered body main surface 2102.

(The Sixth Invention) In the fifth invention, the crystalline nitride layer 2022 has the crystalline nitride layer main surface 2052 facing the heat dissipation layer 2016. The composite layer 2024 has the composite layer main surface 2062 facing the heat dissipation layer 2016 and entirely covers the crystalline nitride layer main surface 2052. The composite layer main surface 2062 has the first region 2122 and the second region 2124.

(The Seventh Invention) In any one of the first to sixth inventions, the crystalline nitride layer 2022 has the crystalline nitride layer main surface 2052 facing the heat dissipation layer 2016. The non-inhibiting portion 2042 and the inhibiting portion 2044 are formed in different regions on the crystalline nitride layer main surface 2052.

(The Eighth Invention) The method of manufacturing the semiconductor device 2000 comprises Steps S101, S102, and S103.

In Step S101, the crystalline nitride layer 2022 having the crystalline nitride layer main surface 2052 is prepared.

In Step S102, the crystalline nitride layer main surface 2052 is covered with the silicon layer 2024 comprising the non-inhibiting portion 2042 which does not inhibit diamond growth on the surface thereof and the inhibiting portion 2044 which inhibits the diamond growth on the surface. The layered body 2014 comprising the crystalline nitride layer 2022 and the composite layer 2024 is thereby obtained. The layered body main surface 2102 of the layered body 2014 has the first region 2122 in which the non-inhibiting portion 2042 is exposed and the second region 2124 in which the inhibiting portion 2044 is exposed.

In Step S103, polycrystalline diamond is deposited on the first region 2122 by the chemical vapor deposition method. The heat dissipation layer 2016 made of the polycrystalline diamond is thereby formed. The heat dissipation layer 2016 is opposed to the layered body main surface 2102, adhered to the first region 2122, and separated from the second region 2124 with the void 2072 interposed therebetween.

(The Ninth Invention) In the eighth invention, the non-inhibiting portion 2042 is made of amorphous silicon, and the inhibiting portion 2044 is made of crystalline silicon. In Step S102, the crystalline nitride layer main surface 2052 is entirely covered with the amorphous silicon layer comprising the first portion and the second portion. Further, the second portion is irradiated with the laser beam. With this irradiation, the first portion becomes the non-inhibiting portion 2042 and the second portion is changed into the inhibiting portion 2044.

According to the semiconductor device 2000 and the method of manufacturing the semiconductor device 2000 of the second preferred embodiment, the stress caused by great difference between the linear expansion coefficient of the heat dissipation layer 2016 and that of the crystalline nitride layer 2022 is relieved by the void 2072, and it is thereby possible to suppress the cracking of the crystalline nitride layer 2022. Further, according to the fourth invention, the plurality of interfaces separated from one another, each of which serves as the interface between the composite layer 2024 and the heat dissipation layer 2016, are formed, and the differential shrinkage in each of the plurality of interfaces thereby becomes smaller and the cracking of the crystalline nitride layer 2022 can be further suppressed. Furthermore, according to the fifth, sixth, or ninth invention, the semiconductor device 2000 can be manufactured by an easy process. Moreover, according to the fifth, sixth, or ninth invention, the composite layer 2042 is in entire contact with the crystalline nitride layer main surface 2052. For this reason, the thermal conductivity in the interface between the crystalline nitride layer 2022 and the composite layer 2024 is improved. In addition, the layered body main surface 2102 becomes almost even, the crystallinity of the diamond forming the heat dissipation layer 2016 formed on the layered body main surface 2102 is improved, and the thermal conductivity of the heat dissipation layer 2016 is improved. The heat dissipation performance of the semiconductor device 2000 is thereby improved.

Figure 14:
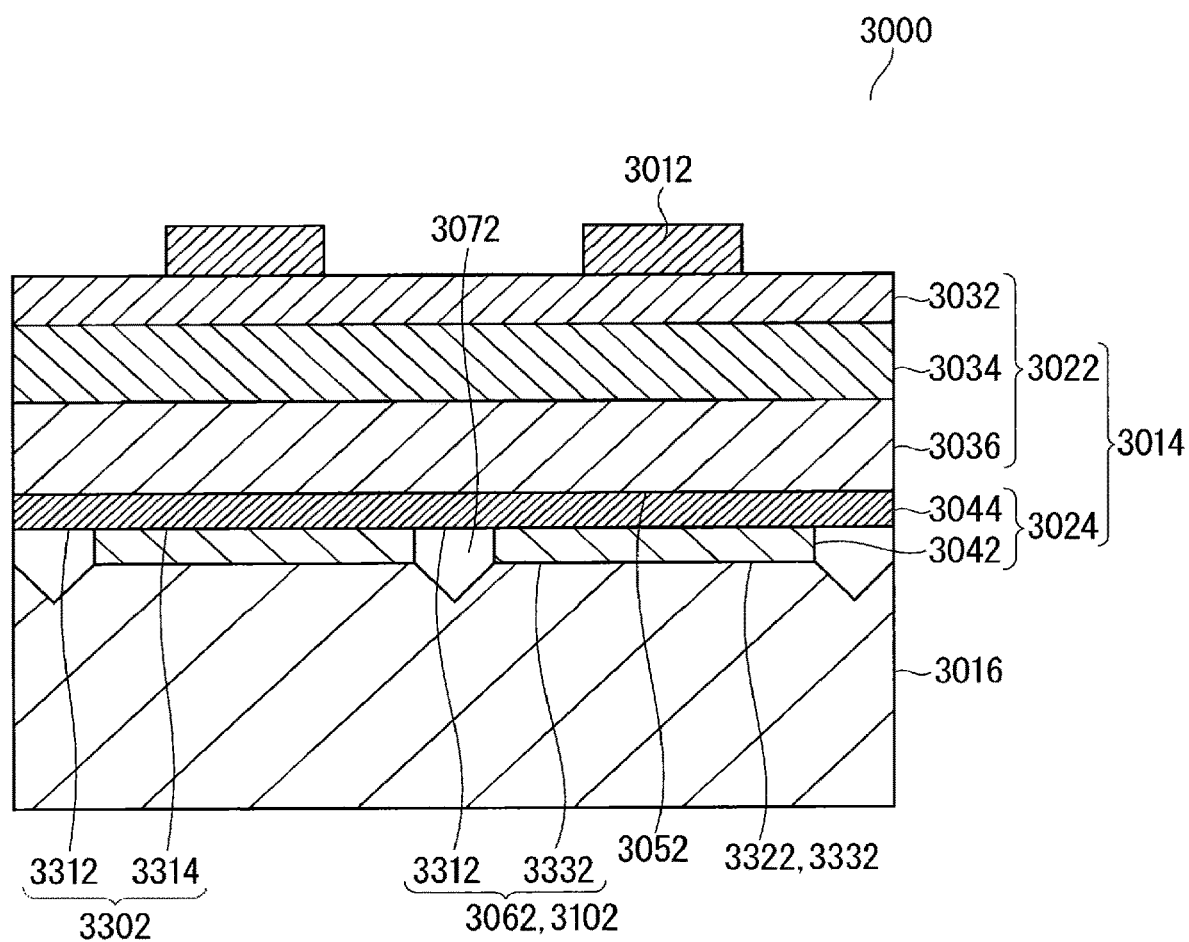
FIG. 14 is a cross section showing a semiconductor device in accordance with the third preferred embodiment.

3. The Third Preferred Embodiment 3.1 Difference from the First Preferred Embodiment FIG. 14 is a schematic view showing a semiconductor device in accordance with the third preferred embodiment. FIG. 14 is a cross section. FIGS. 2 and 3 are also views each showing a planar arrangement of the amorphous portion and the voids included in the semiconductor device in accordance with the third preferred embodiment. FIG. 4 is also a flowchart showing a method of manufacturing the semiconductor device in accordance with the third preferred embodiment.

The semiconductor device 3000 shown in FIG. 14 comprises an electrode 3012, a layered body 3014, and a heat dissipation layer 3016. The layered body 3014 comprises a crystalline nitride layer 3022 and a silicon layer 3024. The crystalline nitride layer 3022 comprises an AlGaN layer 3032, a GaN layer 3034, and a GaN buffer layer 3036. The silicon layer 3024 comprises an amorphous portion 3042 and a crystalline portion 3044. The amorphous portion 3042 serves as a non-inhibiting portion which does not inhibit diamond growth on a surface thereof. The crystalline portion 3044 serves as an inhibiting portion which inhibits the diamond growth on the surface. The silicon layer 3024 is a composite layer consisting of the non-inhibiting portion and the inhibiting portion.

The electrode 3012, the crystalline nitride layer 3022, the AlGaN layer 3032, the GaN layer 3034, and the GaN buffer layer 3036 included in the semiconductor device 3000 of the third preferred embodiment are the same as the electrode 1012, the crystalline nitride layer 1022, the AlGaN layer 1032, the GaN layer 1034, and the GaN buffer layer 1036 included in the semiconductor device 1000 of the first preferred embodiment, respectively. The layered body 3014, the heat dissipation layer 3016, the silicon layer 3024, the amorphous portion 3042, and the crystalline portion 3044 included in the semiconductor device 3000 of the third preferred embodiment are variations of the layered body 1014, the heat dissipation layer 1016, the silicon layer 1024, the amorphous portion 1042, and the crystalline portion 1044 included in the semiconductor device 1000 of the first preferred embodiment, respectively.

Hereinafter, the difference between the first preferred embodiment and the third preferred embodiment will be mainly described. As to the constituent elements not described below, the constituent elements adopted in the first preferred embodiment are also adopted in the third preferred embodiment. The constituent elements adopted in the second preferred embodiment may be adopted in the third preferred embodiment.

In the semiconductor device 1000 of the first preferred embodiment, the amorphous portion 1042 and the crystalline portion 1044 are formed in different regions on the one main surface 1052 of the crystalline nitride layer 1022. On the other hand, in the semiconductor device 3000 of the third preferred embodiment, the crystalline portion 3044 is a crystalline layer which entirely covers one main surface 3052 of the crystalline nitride layer 3022, and the amorphous portion 3042 is an amorphous layer which covers part of one main surface 3302 of the crystalline portion 3044.

The one main surface (crystalline nitride layer main surface) 3052 of the crystalline nitride layer 3022 faces the heat dissipation layer 3016. On the main surface 3052, the silicon layer 3024 is formed. One main surface (composite layer main surface) 3062 of the silicon layer 3024 faces the heat dissipation layer 3016. On the main surface 3062, the heat dissipation layer 3016 is formed. The heat dissipation layer 3016 is opposed to the main surface 3052 with the silicon layer 3024 and a void 3072 interposed therebetween.

The one main surface 3052 of the crystalline nitride layer 3022 is entirely covered with the silicon layer 3024.

The one main surface 3062 of the silicon layer 3024 forms the one main surface 3102 of the layered body 3014. The crystalline portion 3044 entirely covers the one main surface 3052 of the crystalline nitride layer 3022. The one main surface (inhibiting layer main surface) 3302 of the crystalline portion 3044 faces the heat dissipation layer 3016. A region 3312 of the main surface 3302 is not covered with the amorphous portion 3042 and forms the one main surface 3102 of the layered body 3014. The crystalline portion 3044 is exposed in the region 3312. A region (covered region) 3314 of the main surface 3302 is covered with the amorphous portion 3042. One main surface 3322 of the amorphous portion 3042 faces the heat dissipation layer 3016. The main surface 3322 forms the one main surface 3102 of the layered body 3014. The amorphous portion 3042 is exposed in a region 3332 of the main surface 3322.

The one main surface 3102 of the layered body 3014, which faces the heat dissipation layer 3016, thereby has the region (first region) 3332 in which the amorphous portion 3042 is exposed and the region (second region) 3124 in which the crystalline portion 3044 is exposed. The crystalline nitride layer 3022 is not exposed in the main surface 3102.

The semiconductor device 3016 is made of diamond and opposed to the main surface 3102.

The heat dissipation layer 3016 is adhered to the region 3332. The heat can be thereby propagated with high efficiency from the crystalline nitride layer 3022 to the heat dissipation layer 3016 through the amorphous portion 3042, and the heat generated in the crystalline nitride layer 3022 can be escaped with high efficiency. Therefore, the heat dissipation performance of the semiconductor device 3000 is improved.

The heat dissipation layer 3016 is separated from the region 3312 with the void 3072 interposed therebetween. The stress caused by great difference between the linear expansion coefficient of the heat dissipation layer 3016 and that of the crystalline nitride layer 3022 can be thereby relieved by the void 3072, and it is possible to suppress cracking in the crystalline nitride layer 3022.

The amorphous portion 3042 comprises two sub portions 1192 and 1194 separated from each other as shown in FIG. 3. For this reason, the region 3332 in which the amorphous portion 3042 is exposed has two sub regions 1196 and 1198 separated from each other. The two sub portions 1192 and 1194 are exposed in the two sub regions 1196 and 1198, respectively. The heat dissipation layer 3016 is adhered to each of the two sub regions 1196 and 1198. The heat dissipation layer 3016 may be adhered to each of the six sub portions 1132, 1134, 1136, 1138, 1140, and 1142 shown in FIG. 2.

In a case where the semiconductor device 3000 is manufactured, like in the case where the semiconductor device 1000 is manufactured, in Step S101 shown in FIG. 4, the crystalline nitride layer 3022 is prepared. Further, in Step S102 shown in FIG. 4, the one main surface 3052 of the crystalline nitride layer 3022 is covered with the silicon layer 3024, and the layered body 3014 is thereby obtained. Furthermore, in Step S103 shown in FIG. 4, polycrystalline diamond is deposited on the region 3122 of the one main surface 3102 of the layered body 3014 by the CVD method, and the heat dissipation layer 3016 made of the polycrystalline diamond is thereby formed. In addition, in Step S104 shown in FIG. 4, the electrode 3012 is formed.

In Step S102 shown in FIG. 4, however, the one main surface 3052 of the crystalline nitride layer 3022 is entirely covered with the crystalline portion 3044, and the region (covered region) 3314 of the one main surface 3302 of the crystalline portion 3044 is covered with the amorphous portion 3042. With this operation, the one main surface 3322 of the amorphous portion 3042 becomes the region 3332 to which the heat dissipation layer 3016 is adhered, and the region (non-covered region) 3312 of the one main surface 3302 of the crystalline portion 3044 becomes the region 3312 separated from the heat dissipation layer 3016 with the void 3072 interposed therebetween.

In the case where the crystalline portion 3044 is formed, polycrystalline silicon is deposited on the one main surface 3052 of the crystalline nitride layer 3022 by plasma CVD method. The polycrystalline silicon may be deposited by any deposition method other than the plasma CVD method. After the amorphous silicon is deposited, the deposited amorphous silicon may be crystallized by thermal annealing. Part of the silicon substrate used in Step S101 shown in FIG. 4 may be left and used as the crystalline portion 3044.

In the case where the amorphous portion 3042 is formed, amorphous silicon is deposited on the one main surface 3302 of the crystalline portion 3044 by the plasma CVD method. The amorphous silicon may be deposited by any deposition method other than the plasma CVD method.

In order to obtain the amorphous portion 3042 which covers the region 3314 but does not cover the region 3312, after the amorphous silicon is deposited entirely on the one main surface 3302 of the crystalline portion 3044, an unnecessary portion of the deposited amorphous silicon is irradiated with the laser beam and the unnecessary portion after being subjected to the irradiation with the laser beam is removed. The wavelength of the laser beam is selected so that the laser beam should be absorbed by amorphous silicon but hardly absorbed by GaN. The laser beam is typically a second harmonic beam of the YAG laser. The processing of removing the unnecessary portion of the amorphous silicon by the irradiation with the laser beam can be easily performed.

The amorphous portion 3042 which covers the region 3314 but does not cover the region 3312 may be obtained by performing patterning using a photoresist, a mask, or the like. In the patterning using a photoresist, since it is hard to selectively remove only the amorphous silicon by etching and part of the crystalline silicon is removed by etching, a crystalline silicon layer having a thickness larger than the desired thickness is formed. In the patterning using a mask, high-precision patterning in which the masking width is not smaller than 10 μm and not larger than 100 μm is sometimes required.

According to the third preferred embodiment, the process for partially crystallizing the amorphous silicon by the irradiation with the laser beam, which is hard to control, is eliminated and the semiconductor device 3000 can be manufactured by an easy process.

3.2 Inventions Included in the Third Preferred Embodiment

According to the above description, the third preferred embodiment includes the first to fifth inventions relating to the semiconductor device 3000 described below, and includes the sixth and seventh inventions relating to the method of manufacturing the semiconductor device 3000 described below.

(The First Invention) The semiconductor device 3000 comprises the layered body 3014 and the heat dissipation layer 3016.

The layered body 3014 comprises the crystalline nitride layer 3022 and the composite layer 3024. The composite layer 3024 comprises the non-inhibiting portion 3042 which does not inhibit diamond growth on a surface thereof and the inhibiting portion 3044 which inhibits the diamond growth on the surface. The layered body main surface 3102 of the layered body 3014 has the first region 3332 in which the non-inhibiting portion 3042 is exposed and the second region 3312 in which the inhibiting portion 3044 is exposed.

The heat dissipation layer 3016 is made of diamond, opposed to the layered body main surface 3102, adhered to the first region 3332, and separated from the second region 3312 with the void 3072 interposed therebetween.

(The Second Invention) In the first invention, the non-inhibiting portion 3042 is made of amorphous silicon.

(The Third Invention) In the first or second invention, the inhibiting portion 3044 is made of crystalline silicon.

(The Fourth Invention) In any one of the first to third inventions, the first region 3332 comprises the plurality of sub regions 1152, 1154, 1156, 1158, 1160, and 1162 which are separated from one another or the plurality of sub regions 1196 and 1198 which are separated from each other. The heat dissipation layer 3016 is adhered to each of the plurality of sub regions 1152, 1154, 1156, 1158, 1160, and 1162 or each of the plurality of sub regions 1196 and 1198.

(The Fifth Invention) In any one of the first to fourth inventions, the crystalline nitride layer 3022 has the crystalline nitride layer main surface 3052 facing the heat dissipation layer 3016. The inhibiting portion 3044 is an inhibiting layer which has the inhibiting layer main surface 3302 facing the heat dissipation layer 3016 and covers the crystalline nitride layer main surface 3052. The inhibiting layer main surface 3302 has the second region 3312 and the covered region 3314 covered with the non-inhibiting portion 3042. The non-inhibiting portion 3042 is a non-inhibiting layer which has the non-inhibiting layer main surface 3322 facing the heat dissipation layer 3016. The non-inhibiting layer main surface 3322 has the first region 3332.

(The Sixth Invention) The method of manufacturing the semiconductor device 3000 comprises Steps S101, S102, and S103.

In Step S101, the crystalline nitride layer 3022 having the crystalline nitride layer main surface 3052 is prepared.

In Step S102, the crystalline nitride layer main surface 3052 is covered with the composite layer 3024 comprising the non-inhibiting portion 3042 which does not inhibit diamond growth on the surface thereof and the inhibiting portion 3044 which inhibits the diamond growth on the surface. The layered body 3014 comprising the crystalline nitride layer 3022 and the composite layer 3024 is thereby obtained. The layered body main surface 3102 of the layered body 3014 has the first region 3332 in which the non-inhibiting portion 3042 is exposed and the second region 3312 in which the inhibiting portion 3044 is exposed.

In Step S103, polycrystalline diamond is deposited on the first region 3332 by the chemical vapor deposition method. The heat dissipation layer 3016 made of the polycrystalline diamond is thereby formed. The heat dissipation layer 3016 is opposed to the layered body main surface 3102, adhered to the first region 3332, and separated from the second region 3312 with the void 3072 interposed therebetween.

(The Seventh Invention) In the sixth invention, the inhibiting portion 3044 is an inhibiting layer having the inhibiting layer main surface 3302. The inhibiting layer main surface 3302 has the covered region 3314 and the non-covered region 3312. The non-inhibiting portion 3042 is a non-inhibiting layer having the non-inhibiting layer main surface 3322.

In Step S102, the crystalline nitride layer main surface 3052 is covered with the inhibiting portion 3044.

Further, the covered region 3314 is covered with the non-inhibiting portion 3042, and the non-inhibiting layer main surface 3322 becomes the first region 3332, and the non-covered region 3312 becomes the second region 3312.

According to the semiconductor device 3000 and the method of manufacturing the semiconductor device 3000 of the third preferred embodiment, the stress caused by great difference between the linear expansion coefficient of the heat dissipation layer 3016 and that of the crystalline nitride layer 3022 is relieved by the void 3072, and it is thereby possible to suppress the cracking of the crystalline nitride layer 3022. Further, according to the fourth invention, the plurality of interfaces separated from one another, each of which serves as the interface between the composite layer 3024 and the heat dissipation layer 3016, are formed, and the differential shrinkage in each of the plurality of interfaces thereby becomes smaller and the cracking of the crystalline nitride layer 3022 can be further suppressed. Furthermore, according to the fifth or seventh invention, the semiconductor device 3000 can be manufactured by an easy process.

Figure 15:
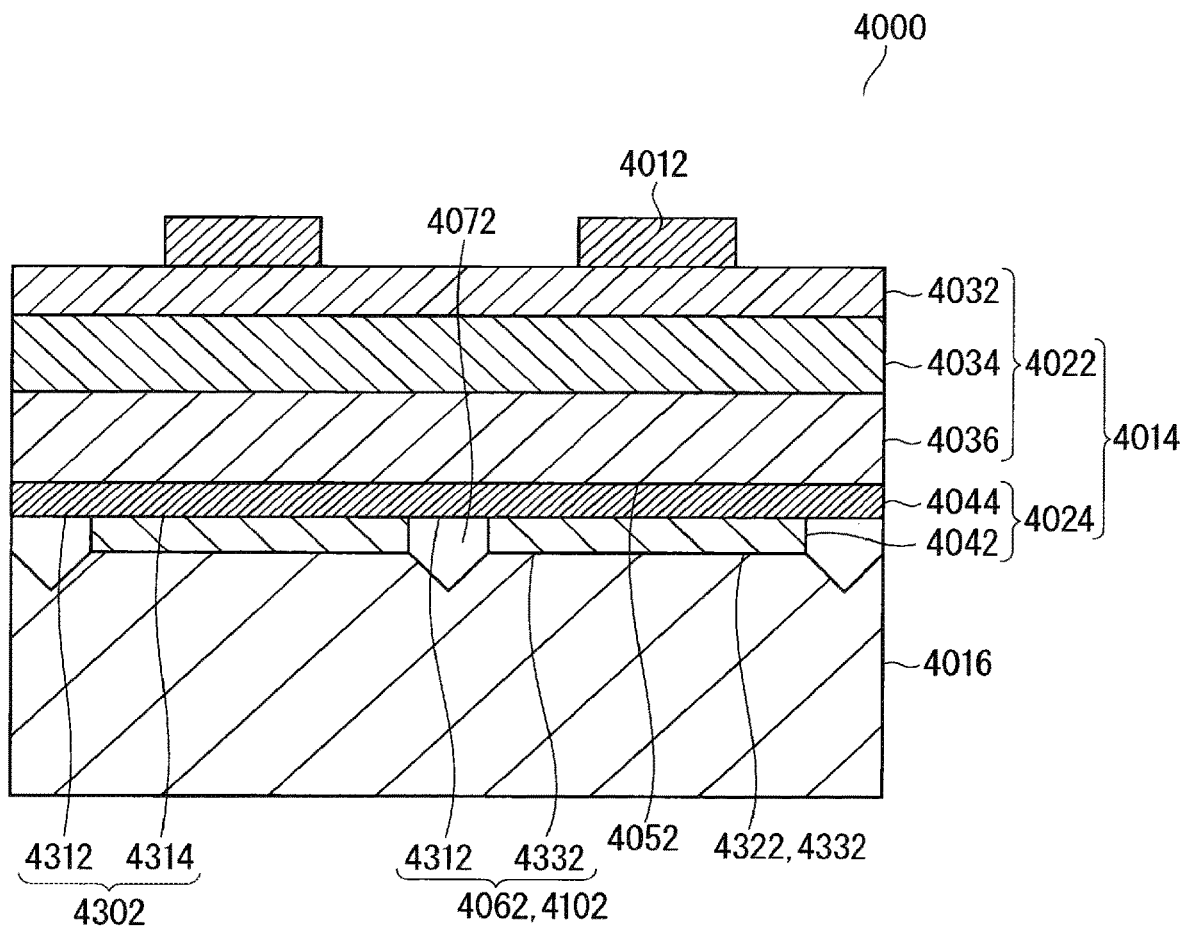
FIG. 15 is a cross section showing a semiconductor device in accordance with the fourth preferred embodiment.
Figure 16:
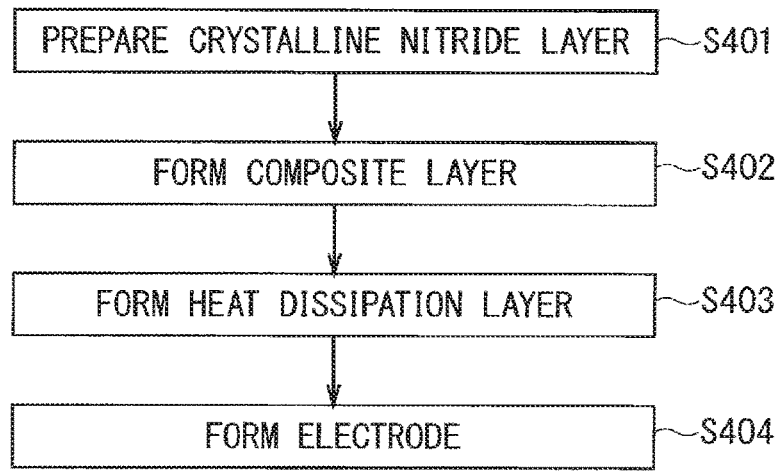
FIG. 16 is a flowchart showing a method of manufacturing the semiconductor device in accordance with the fourth preferred embodiment.

4. The Fourth Preferred Embodiment 4.1 Difference from the Third Preferred Embodiment FIG. 15 is a cross section showing a semiconductor device in accordance with the fourth preferred embodiment. FIGS. 2 and 3 are also views each showing a planar arrangement of the amorphous portion and the voids included in the semiconductor device in accordance with the fourth preferred embodiment. FIG. 16 is a flowchart showing a method of manufacturing the semiconductor device in accordance with the fourth preferred embodiment.

The semiconductor device 4000 shown in FIG. 15 comprises an electrode 4012, a layered body 4014, and a heat dissipation layer 4016. The layered body 4014 comprises a crystalline nitride layer 4022 and a composite layer 4024. The crystalline nitride layer 4022 comprises an AlGaN layer 4032, a GaN layer 4034, and a GaN buffer layer 4036. The composite layer 4024 comprises an amorphous portion 4042 and an aluminum nitride portion 4044. The amorphous portion 4042 serves as a non-inhibiting portion which does not inhibit diamond growth on a surface thereof. The aluminum nitride portion 4044 serves as an inhibiting portion which inhibits the diamond growth on the surface. The inhibiting portion made of the aluminum nitride portion 4044 may be replaced with an inhibiting portion made of a diamond-like carbon portion.

The electrode 4012, the heat dissipation layer 4016, the crystalline nitride layer 4022, the AlGaN layer 4032, the GaN layer 4034, the GaN buffer layer 4036, the amorphous portion 4042 included in the semiconductor device 4000 of the fourth preferred embodiment are the same as the electrode 3012, the heat dissipation layer 3016, the crystalline nitride layer 3022, the AlGaN layer 3032, the GaN layer 3034, the GaN buffer layer 3036, and the amorphous portion 3042 included in the semiconductor device 3000 of the third preferred embodiment, respectively. The layered body 4014 and the composite layer 4024 included in the semiconductor device 4000 of the fourth preferred embodiment are variations of the layered body 3014 and the silicon layer 3024 included in the semiconductor device 3000 of the third preferred embodiment, respectively. The layered body 4014 and the composite layer 4024 included in the semiconductor device 4000 of the fourth preferred embodiment are different from the layered body 3014 and the silicon layer 3024 included in the semiconductor device 3000 of the third preferred embodiment, respectively, in that the crystalline portion 3044 may be placed with the aluminum nitride portion 4044.

Hereinafter, the difference between the third preferred embodiment and the fourth preferred embodiment will be mainly described. As to the constituent elements not described below, the constituent elements adopted in the third preferred embodiment are also adopted in the fourth preferred embodiment. The constituent elements adopted in the first or second preferred embodiment may be adopted in the fourth preferred embodiment.

Though the crystalline portion 3044 made of crystalline silicon serves as the inhibiting portion which inhibits the diamond growth on the surface thereof in the semiconductor device 3000 of the third preferred embodiment, the aluminum nitride portion 4044 made of aluminum nitride serves as the inhibiting portion which inhibits the diamond growth on the surface thereof in the semiconductor device 4000 of the fourth preferred embodiment.

One main surface (crystalline nitride layer main surface) 4052 of the crystalline nitride layer 4022 faces the heat dissipation layer 4016. On the main surface 4052, the composite layer 4024 is formed. One main surface (composite layer main surface) 4062 of the composite layer 4024 faces the heat dissipation layer 4016. On the main surface 4062, the heat dissipation layer 4016 is formed. The heat dissipation layer 4016 is opposed to the main surface 4052 with the composite layer 4024 and a void 4072 interposed therebetween.

The one main surface 4052 of the crystalline nitride layer 4022 is entirely covered with the composite layer 4024.

The one main surface 4062 of the composite layer 4024 forms one main surface 4102 of the layered body 4014. The aluminum nitride portion 4044 entirely covers the one main surface 4052 of the crystalline nitride layer 4022. One main surface (inhibiting layer main surface) 4302 of the aluminum nitride portion 4044 faces the heat dissipation layer 4016. A region 4312 of the main surface 4302 is not covered with the amorphous portion 4042 and forms the one main surface 4102 of the layered body 4014. In the region 4312, the aluminum nitride portion 4044 is exposed. A region (covered region) 4314 of the main surface 4302 is covered with the amorphous portion 4042. One main surface 4322 of the amorphous portion 4042 faces the heat dissipation layer 4016. The main surface 4322 forms the one main surface 4102 of the layered body 4014. In a region 4332 of the main surface 4322, the amorphous portion 4042 is exposed.

The composite layer 4024 which is a thin film layered body is thereby formed. Further, the one main surface 4102 of the layered body 4014, which faces the heat dissipation layer 4016, has the region (first region) 4332 in which the amorphous portion 4042 is exposed and the region (second region) 4312 in which the aluminum nitride portion 4044 is exposed. The crystalline nitride layer 4022 is not exposed in the main surface 4102.

The heat dissipation layer 4016 is adhered to the region 4332. The heat can be thereby propagated with high efficiency from the crystalline nitride layer 4022 to the heat dissipation layer 4016 through the amorphous portion 4042, and the heat generated in the crystalline nitride layer 4022 can be escaped with high efficiency. Therefore, the heat dissipation performance of the semiconductor device 4000 is improved.

The heat dissipation layer 4016 is separated from the region 4312 with the void 4072 interposed therebetween. The stress caused by great difference between the linear expansion coefficient of the heat dissipation layer 4016 and that of the crystalline nitride layer 4022 can be thereby relieved by the void 4072, and it is possible to suppress cracking in the crystalline nitride layer 4022.

The amorphous portion 4042 comprises two sub portions 1192 and 1194 separated from each other as shown in FIG. 3. For this reason, the region 4332 in which the amorphous portion 4042 is exposed has two sub regions 1196 and 1198 separated from each other. The two sub portions 1192 and 1194 are exposed in the two sub regions 1196 and 1198, respectively. The heat dissipation layer 4016 is adhered to each of the two sub regions 1196 and 1198. The heat dissipation layer 4016 may be adhered to each of the six sub portions 1132, 1134, 1136, 1138, 1140, and 1142 shown in FIG. 2.

In a case where the semiconductor device 4000 is manufactured, in Step S401 shown in FIG. 16, the crystalline nitride layer 4022 is prepared. Further, in Step S402 shown in FIG. 16, the one main surface 4052 of the crystalline nitride layer 4022 is covered with the composite layer 4024, and the layered body 4014 is thereby obtained. Furthermore, in Step S403 shown in FIG. 16, polycrystalline diamond is deposited on the region 4122 of the one main surface 4102 of the layered body 4014 by the CVD method, and the heat dissipation layer 4016 made of the polycrystalline diamond is thereby formed. In addition, in Step S404 shown in FIG. 16, the electrode 4012 is formed.

The manufacture of the semiconductor device 4000 of the fourth preferred embodiment is different from that of the semiconductor device 3000 of the third preferred embodiment in that the aluminum nitride portion 4044 made of aluminum nitride is formed instead of the crystalline portion 3044 made of crystalline silicon. The aluminum nitride portion 4044 is formed by depositing aluminum nitride on the one main surface 4052 of the crystalline nitride layer 4022 by sputtering. The diamond-like carbon portion which may be formed instead of the aluminum nitride portion 4044 is also formed by depositing diamond-like carbon on the one main surface 4052 of the crystalline nitride layer 4022 by sputtering. The aluminum nitride or the diamond-like carbon may be deposited by any deposition method other than the sputtering method.

According to the semiconductor device 4000 of the fourth preferred embodiment, the process for partially crystallizing the amorphous silicon by the irradiation with the laser beam, which is hard to control, is eliminated and the semiconductor device 4000 can be manufactured by an easy process.

Further, according to the semiconductor device 4000 of the fourth preferred embodiment, since the one main surface 4052 of the crystalline nitride layer 4022 is covered with the aluminum nitride portion 4044 having an electric conductivity lower than that of the crystalline portion 3044 made of polycrystalline silicon, the parasitic capacitance which produces a large effect on the characteristics of the high-frequency device is reduced and the high-frequency characteristics of the semiconductor device 4000 is improved. This advantage is caused also in the case where the diamond-like carbon portion is formed instead of an aluminum nitride portion 4044.

4.2 Inventions Included in the Fourth Preferred Embodiment

According to the above description, the fourth preferred embodiment includes the first to fifth inventions relating to the semiconductor device 4000 described below, and includes the sixth and seventh inventions relating to the method of manufacturing the semiconductor device 4000 described below.

(The First Invention) The semiconductor device 4000 comprises the layered body 4014 and the heat dissipation layer 4016.

The layered body 4014 comprises the crystalline nitride layer 4022 and the composite layer 4024. The composite layer 4024 comprises the non-inhibiting portion 4042 which does not inhibit diamond growth on a surface thereof and the inhibiting portion 4044 which inhibits the diamond growth on the surface. The layered body main surface 4102 of the layered body 4014 has the first region 4332 in which the non-inhibiting portion 4042 is exposed and the second region 4312 in which the inhibiting portion 4044 is exposed.

The heat dissipation layer 4016 is made of diamond, opposed to the layered body main surface 4102, adhered to the first region 4332, and separated from the second region 4312 with the void 4072 interposed therebetween.

(The Second Invention) In the first invention, the non-inhibiting portion 4042 is made of amorphous silicon.

(The Third Invention) In the first or second invention, the inhibiting portion 4044 is made of aluminum nitride or diamond-like carbon.

(The Fourth Invention) In any one of the first to third inventions, the first region 4332 comprises the plurality of sub regions 1152, 1154, 1156, 1158, 1160, and 1162 which are separated from one another or the plurality of sub regions 1196 and 1198 which are separated from each other. The heat dissipation layer 4016 is adhered to each of the plurality of sub regions 1152, 1154, 1156, 1158, 1160, and 1162 or each of the plurality of sub regions 1196 and 1198.

(The Fifth Invention) In any one of the first to fourth inventions, the crystalline nitride layer 4022 has the crystalline nitride layer main surface 4052 facing the heat dissipation layer 4016. The inhibiting portion 4044 is an inhibiting layer which has the inhibiting layer main surface 4302 facing the heat dissipation layer 4016 and covers the crystalline nitride layer main surface 4052. The inhibiting layer main surface 4302 has the second region 4312 and the covered region 4314 covered with and the non-inhibiting portion 4042. The non-inhibiting portion 4042 is a non-inhibiting layer which has the non-inhibiting layer main surface 4322 facing the heat dissipation layer 4016. The non-inhibiting layer main surface 4322 has the first region 4332.

(The Sixth Invention) The method of manufacturing the semiconductor device 4000 comprises Steps S401, S402, and S403.

In Step S401, the crystalline nitride layer 4022 having the crystalline nitride layer main surface 4052 is prepared.

In Step S402, the crystalline nitride layer main surface 4052 is covered with the composite layer 4024 comprising the non-inhibiting portion 4042 which does not inhibit diamond growth on the surface thereof and the inhibiting portion 4044 which inhibits the diamond growth on the surface. The layered body 4014 comprising the crystalline nitride layer 4022 and the composite layer 4024 is thereby obtained. The layered body main surface 4102 of the layered body 4014 has the first region 4332 in which the non-inhibiting portion 4042 is exposed and the second region 4312 in which the inhibiting portion 4044 is exposed.

In Step S403, polycrystalline diamond is deposited on the first region 4332 by the chemical vapor deposition method. The heat dissipation layer 4016 made of the polycrystalline diamond is thereby formed. The heat dissipation layer 4016 is opposed to the layered body main surface 4102, adhered to the first region 4332, and separated from the second region 4312 with the void 4072 interposed therebetween.

(The Seventh Invention) In the sixth invention, the inhibiting portion 4044 is an inhibiting layer having the inhibiting layer main surface 4302. The inhibiting layer main surface 4302 has the covered region 4314 and the non-covered region 4312. The non-inhibiting portion 4042 is a non-inhibiting layer having the non-inhibiting layer main surface 4322.

In Step S402, the crystalline nitride layer main surface 4052 is covered with the inhibiting portion 4044.

Further, the covered region 4314 is covered with the non-inhibiting portion 4042, and the non-inhibiting layer main surface 4322 becomes the first region 4332, and the non-covered region 4312 becomes the second region 4312.

According to the semiconductor device 4000 and the method of manufacturing the semiconductor device 4000 of the fourth preferred embodiment, the stress caused by great difference between the linear expansion coefficient of the heat dissipation layer 4016 and that of the crystalline nitride layer 4022 is relieved by the void 4072, and it is thereby possible to suppress the cracking of the crystalline nitride layer 4022. Further, according to the third invention, since the crystalline nitride layer main surface 4052 is covered with aluminum nitride or diamond-like carbon having a low electric conductivity, the parasitic capacitance which produces a large effect on the characteristics of the high-frequency device is reduced and the high-frequency characteristics of the semiconductor device 4000 is improved. Furthermore, according to the fourth invention, the plurality of interfaces separated from one another, each of which serves as the interface between the composite layer 4024 and the heat dissipation layer 4016, are formed, and the differential shrinkage in each of the plurality of interfaces thereby becomes smaller and the cracking of the crystalline nitride layer 4022 can be further suppressed. Furthermore, according to the fifth or seventh invention, the semiconductor device 4000 can be manufactured by an easy process.

Further, in the present invention, the preferred embodiments may be freely combined, or may be changed or omitted as appropriate, without departing from the scope of the invention.

While the invention has been shown and described in detail, the foregoing description is in all aspects illustrative and not restrictive. It is therefore understood that numerous modifications and variations can be devised without departing from the scope of the invention.

EXPLANATION OF REFERENCE SIGNS 1000, 2000, 3000, 4000 semiconductor device, 1014, 2014, 3014, 4014 layered body, 1016, 2016, 3016, 4016 heat dissipation layer, 1022, 2022, 3022, 4022 crystalline nitride layer, 1024, 2024, 3024 silicon layer, 4024 composite layer, 1042, 2042, 3042, 4042 amorphous portion, 1044, 2044, 3044 crystalline portion, 4044 aluminum nitride portion, 1072, 1074, 2072, 3072, 4072 void

The invention claimed is:

1. A semiconductor device, comprising:
a layered body comprising a crystalline nitride layer and a composite layer, wherein the composite layer has a non-inhibiting material which does not inhibit diamond growth on a surface thereof and an inhibiting material which inhibits the diamond growth on a surface thereof such that a main surface of the layered body has a first region which is the surface of the non-inhibiting material and a second region which is the surface of the inhibiting material, where the first region is flat; and
a heat dissipation layer made of diamond and formed on the main surface of the layered body such that the heat dissipation layer is adhered to the first region and separated from the second region with a void formed between the heat dissipation layer and the second region, and that the void is tapered from the second region toward a tip of the void that exists in the heat dissipation layer, wherein
the void is a first void,
the main surface of the layered body further has a third region in Which the crystalline nitride layer is exposed, and
the heat dissipation layer is separated from the third region with a second void extending from the heat dissipation layer to the third region.

2. The semiconductor device according to claim 1, wherein the non-inhibiting material is made of amorphous silicon.

3. The semiconductor device according to claim 1, wherein the inhibiting material is made of crystalline silicon, aluminum nitride, or diamond-like carbon.

4. The semiconductor device according to claim 1, wherein:
the first region comprises a plurality of sub regions separated from one another, and
the heat dissipation layer is adhered to each of the plurality of sub regions.

5. The semiconductor device according to claim 1, wherein:
the crystalline nitride layer has a main surface facing the heat dissipation layer,
the main surface of the crystalline nitride layer has a covered region covered with the third region and the composite layer,
the composite layer has a main surface facing the heat dissipation layer, and
the main surface of the composite layer has the first region and the second region.

6. The semiconductor device according to claim 1, wherein:
the crystalline nitride layer is not exposed to the main surface of the layered body.

7. The semiconductor device according to claim 1, wherein:
the crystalline nitride layer has a main surface facing the heat dissipation layer, and
the non-inhibiting material and the inhibiting material are formed on different regions on the main surface of the crystalline nitride layer.

8. A method of manufacturing a semiconductor device, comprising:
a) preparing a crystalline nitride layer having a crystalline nitride layer main surface;
b) covering the crystalline nitride layer main surface with a composite layer comprising a non-inhibiting material which does not inhibit diamond growth on a surface thereof and an inhibiting material which inhibits the diamond growth on a surface thereof, thereby obtaining a layered body which comprises the crystalline nitride layer and the composite layer and has a layered body main surface having a first region which is the surface of the non-inhibiting material and is flat, and a second region which is the surface of the inhibiting material; and
c) depositing polycrystalline diamond on the first region by chemical vapor deposition method, to thereby form a heat dissipation layer made of polycrystalline diamond on the layered body main surface, such that the heat dissipation layer is adhered to the first region and separated from the second region with a void formed between the heat dissipation layer and the second region, and that the void is tapered from the second region toward a tip portion of the void that exists in the heat dissipation layer, wherein
the void is a first void,
the layered body main surface has a third region in which the crystalline nitride layer is exposed, and
the heat dissipation layer is separated from the third region with a second void extending from the heat dissipation layer to the third region.

9. The method of manufacturing a semiconductor device according to claim 8, wherein:
the non-inhibiting material is made of amorphous silicon,
the inhibiting material is made of crystalline silicon,
in b), the crystalline nitride layer main surface is covered with an amorphous silicon layer comprising a first portion, a second portion, and a third portion, and by irradiating the second portion with a laser beam having a first intensity and irradiating the third portion with a laser beam having a second intensity higher than the first intensity, the first portion becomes the non-inhibiting material, the second portion is changed into the inhibiting material, the third portion is removed.

10. The semiconductor device according to claim 2, wherein the inhibiting material is made of crystalline silicon, aluminum nitride, or diamond-like carbon.

11. The semiconductor device according to claim 1, wherein the first region constitutes a main surface of the composite layer.

12. The semiconductor device according to claim 1, wherein the first region and the second region constitute a same plane.

13. The semiconductor device according to claim 1, wherein the composite layer is formed by partially irradiating an amorphous silicon layer with laser beam.

* * * * *